United States Patent
Xie et al.

(10) Patent No.: US 9,454,888 B2
(45) Date of Patent: *Sep. 27, 2016

(54) ADVANCED BATTERY EARLY WARNING AND MONITORING SYSTEM

(71) Applicant: INDIANA UNIVERSITY RESEARCH AND TECHNOLOGY CORPORATION, Indianapolis, IN (US)

(72) Inventors: Jian Xie, Carmel, IN (US); Jie Chen, Carmel, IN (US); Lingxi Li, Zionsville, IN (US); Yaobin Chen, Carmel, IN (US)

(73) Assignee: Indiana University Research and Technology Corporation, Indianapolis, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/923,852

(22) Filed: Oct. 27, 2015

(65) Prior Publication Data

US 2016/0055736 A1    Feb. 25, 2016

Related U.S. Application Data

(63) Continuation of application No. 13/731,788, filed on Dec. 31, 2012, now Pat. No. 9,177,466, which is a continuation-in-part of application No. 13/355,320, filed on Jan. 20, 2012, now Pat. No. 8,952,823.

(60) Provisional application No. 61/589,051, filed on Jan. 20, 2012, provisional application No. 61/434,697, filed on Jan. 20, 2011.

(51) Int. Cl.
G08B 21/00  (2006.01)
G08B 21/18  (2006.01)
G08B 29/18  (2006.01)
G01R 31/36  (2006.01)
(Continued)

(52) U.S. Cl.
CPC ......... *G08B 21/185* (2013.01); *G01R 31/3606* (2013.01); *G01R 31/3658* (2013.01); *G08B 29/181* (2013.01); *G01R 31/3651* (2013.01); *G01R 31/3675* (2013.01)

(58) Field of Classification Search
CPC .......... Y02T 10/7005; G01R 31/3648; G01R 31/3662; H02J 7/0063; H02J 7/007
USPC .......... 340/636.12, 636.11; 324/427; 370/241
See application file for complete search history.

(56) References Cited

U.S. PATENT DOCUMENTS

| | | |
|---|---|---|
| 2003/0184307 A1 | 10/2003 | Kozlowski et al. |
| 2007/0080662 A1* | 4/2007 | Wu ..................... B60L 3/0046 320/110 |
| 2009/0085527 A1 | 4/2009 | Odaohhara |

(Continued)

*Primary Examiner* — Jack K Wang
(74) *Attorney, Agent, or Firm* — Faegre Baker Daniels LLP

(57) ABSTRACT

Systems, apparatuses and methods for detecting internal cell faults using online and real-time sensing techniques, and providing an accurate and reliable early warning for the incoming failure of battery cells hours or days prior to failure. A system is configured to perform real-time and direct measurement of battery cell parameters of temperature, voltage, and AC impedance through online sensing. These parameters may be simultaneously processed using advanced probabilistic and/or fuzzy logic-based algorithms to provide an early warning for the incoming failure of battery cells in a battery pack. This technology may safeguard the LIB battery packs while allowing them to operate at or near 100% capacity in both transportation and stationary applications.

2 Claims, 25 Drawing Sheets

(51) Int. Cl.
*G01N 27/416* (2006.01)
*G01R 31/08* (2006.01)

(56) References Cited

U.S. PATENT DOCUMENTS

| | | |
|---|---|---|
| 2009/0322340 A1 | 12/2009 | Zhang et al. |
| 2010/0327810 A1 | 12/2010 | Jimbo et al. |
| 2011/0106280 A1* | 5/2011 | Zeier .................... H01M 10/42 700/90 |
| 2011/0199053 A1* | 8/2011 | Minamiura ......... H01M 10/441 320/136 |
| 2012/0025842 A1 | 2/2012 | Gibbs et al. |
| 2012/0307645 A1 | 12/2012 | Grosman et al. |
| 2013/0049973 A1* | 2/2013 | Matsumoto ........... B60L 3/0046 340/636.12 |
| 2013/0072154 A1 | 3/2013 | Rich et al. |

* cited by examiner

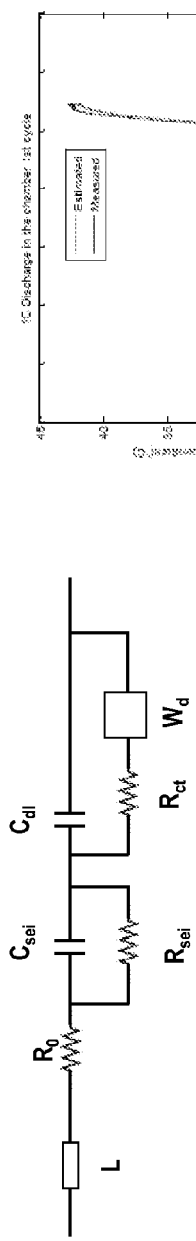
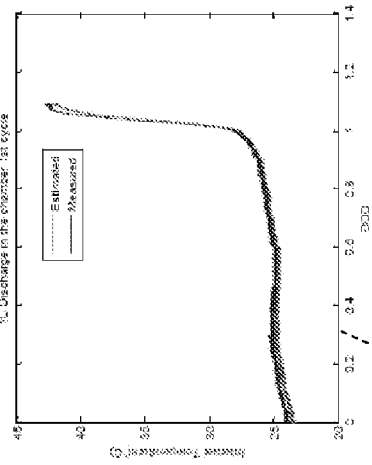
FIG. 4A
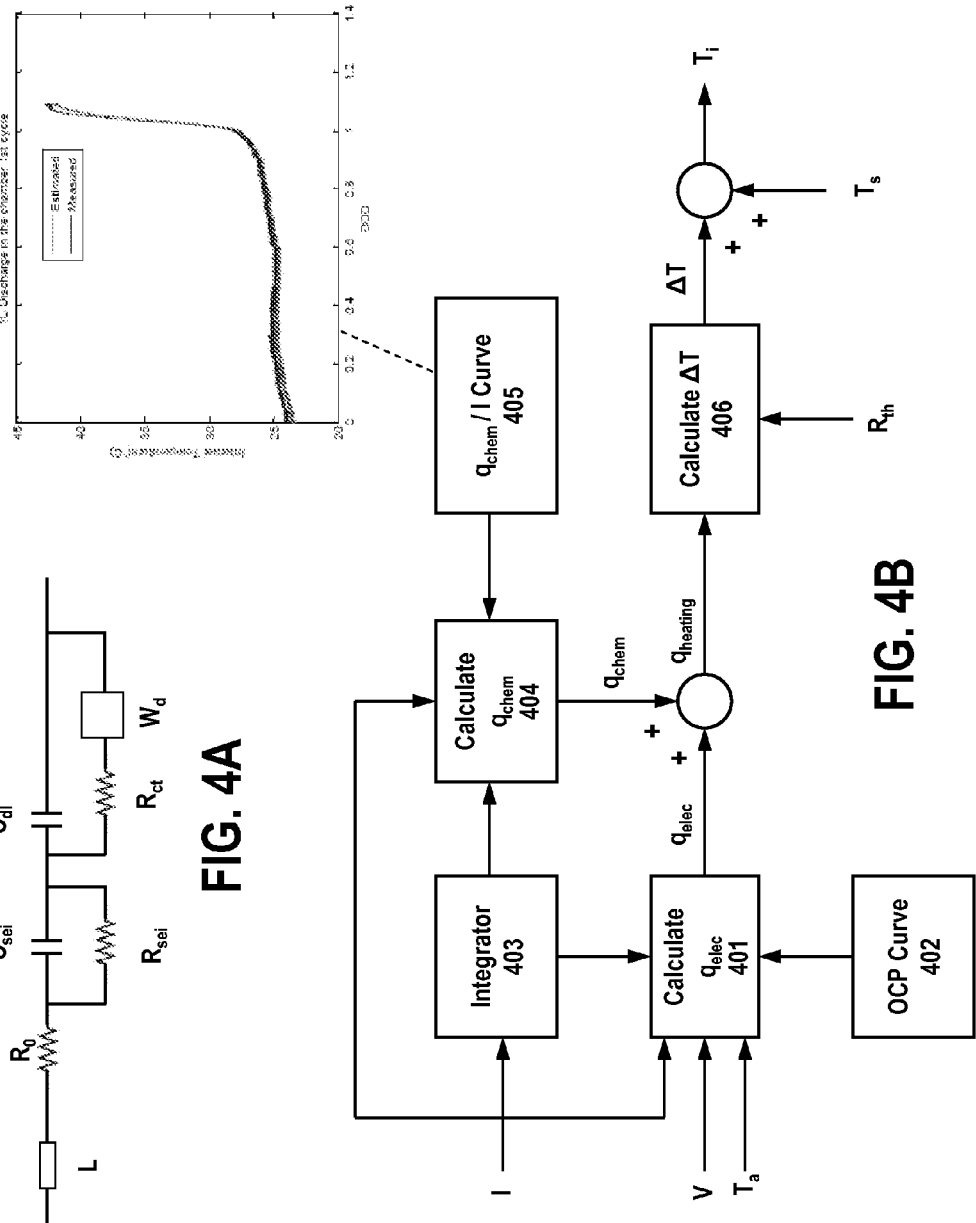
**FIG. 4B

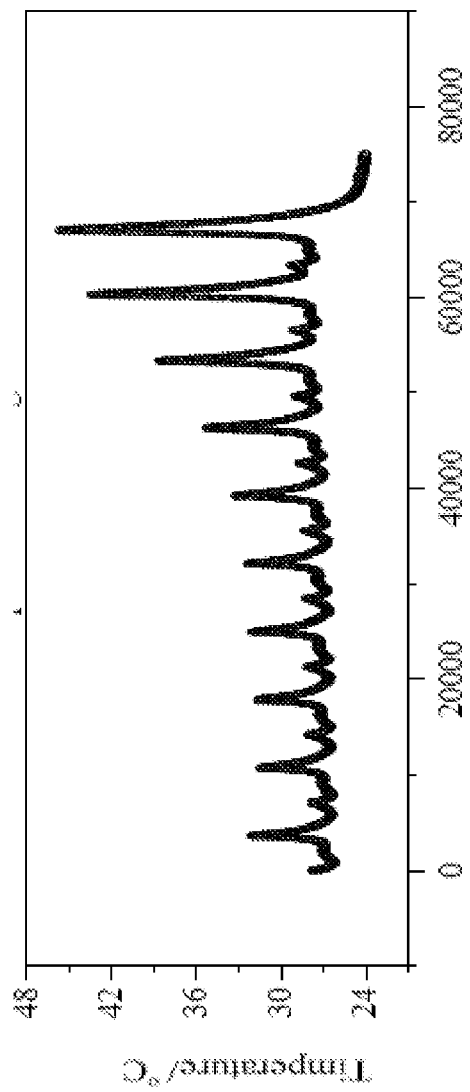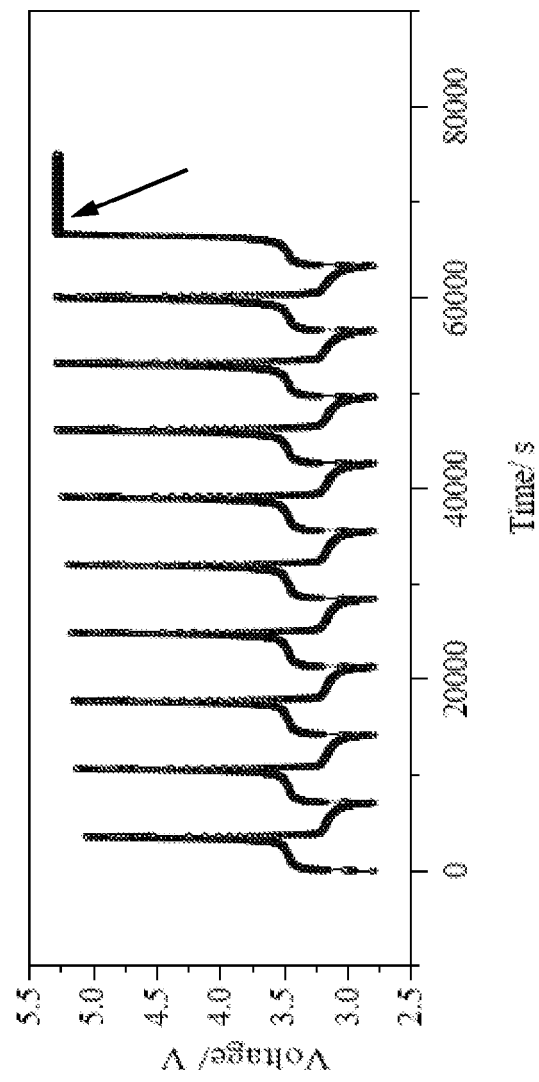

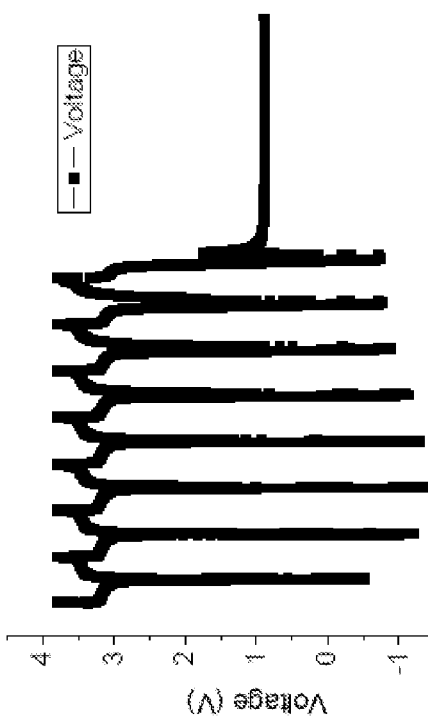
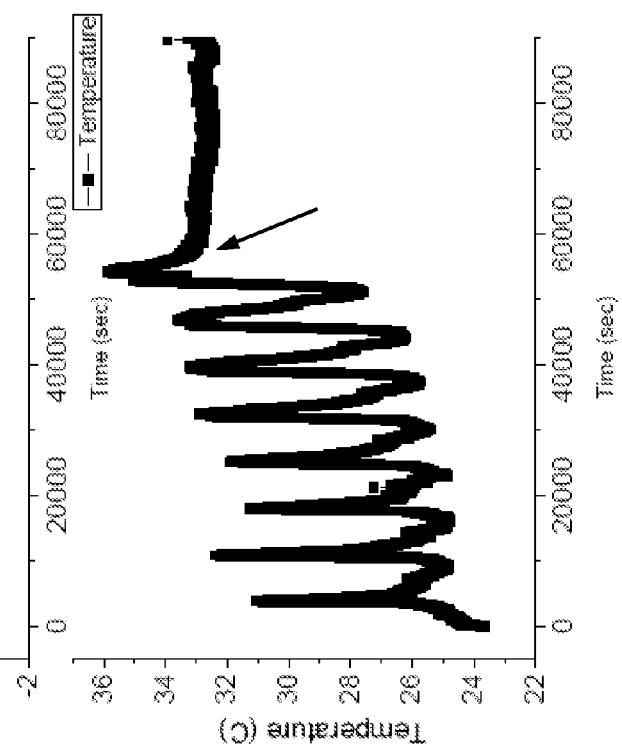
FIG. 5C
FIG. 5D

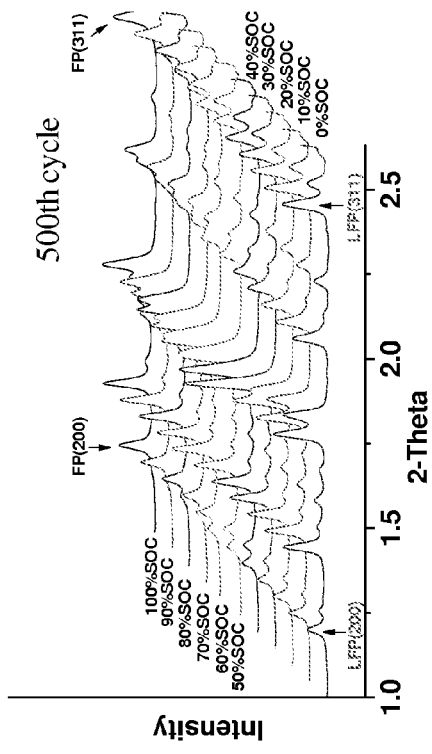
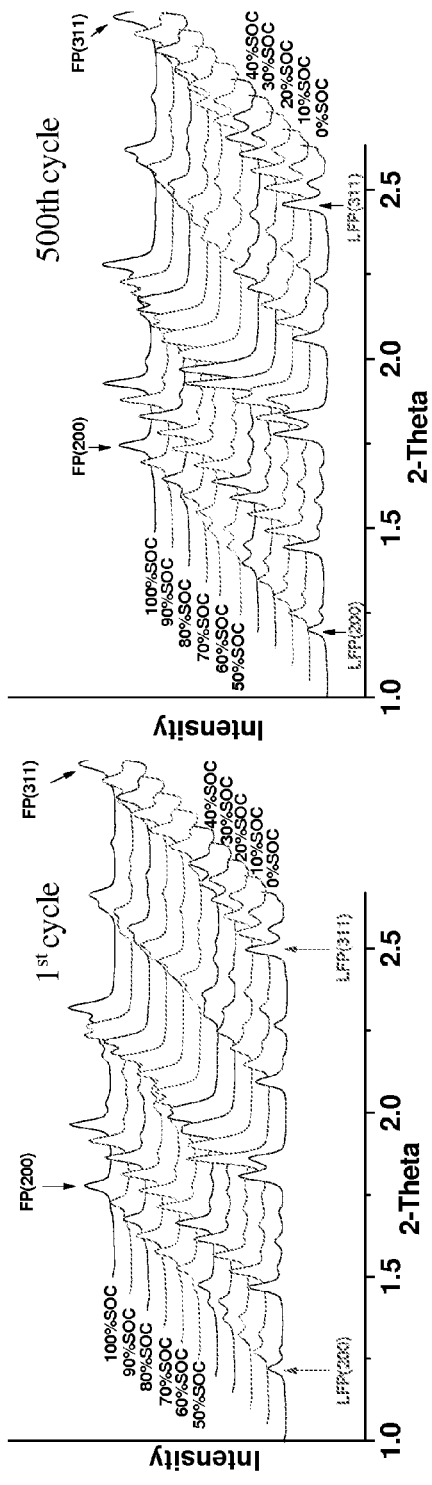
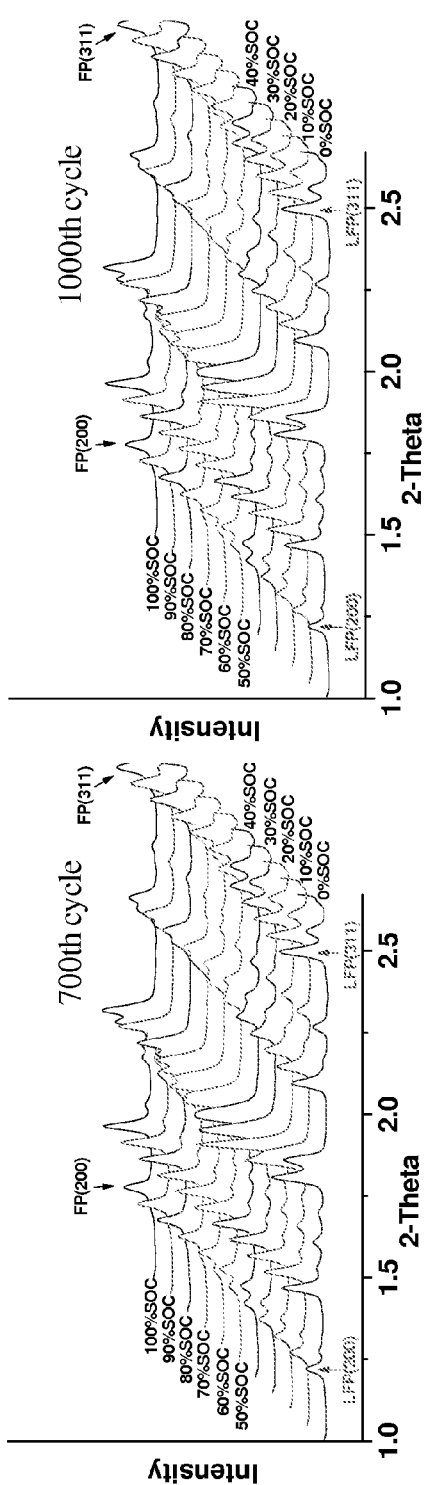

ADVANCED BATTERY EARLY WARNING AND MONITORING SYSTEM

RELATED APPLICATIONS

This application is a continuation of U.S. Non-Provisional application Ser. No. 13/731,788, filed Dec. 31, 2012, which claims the benefit, under 35 U.S.C. §119(e), of U.S. Provisional Patent Application No. 61/589,051, Jan. 20, 2012, and is also a continuation-in-part of U.S. Non-Provisional patent application Ser. No. 13/355,320, filed Jan. 20, 2012, now U.S. Pat. No. 8,952,823, issued on Feb 10, 2015, which claims the benefit under 35 U.S.C. §119(e) of U.S. Provisional Patent Application No. 61/434,697, which was filed Jan. 20, 2011, the contents of all of which are hereby incorporated in their entirety by reference.

GOVERNMENT RIGHTS

This invention was made with government support under grant number N00164-09-C-GS42 awarded by the Naval Surface Warfare Center Crane Department of Defense. The government has certain rights in the invention.

TECHNICAL FIELD

The present disclosure is directed to battery monitoring and notification. More specifically, the present disclosure is directed to monitoring of one or more battery conditions and communicating a warning signal when a failure condition is present, and further providing techniques for processing battery conditions in order to determine impending failures that are likely to occur in the future.

BACKGROUND INFORMATION

Battery-powered electronic devices have become ubiquitous in modern society. The recent rapid expansion of the use of portable devices, electrically powered motors and the like has created a strong demand for fast deployment of battery technologies. The design of a battery-powered device requires many battery-management features, including charge control, battery-capacity monitoring, remaining runtime information, charge-cycle counting, and so on. Generally speaking, the basic task of a Battery Management System (BMS) is to ensure that optimum use is made of the energy inside the battery powering the portable product and that the risk of damage to the battery or surrounding circuitry is prevented. This may be achieved by monitoring and controlling the battery's charging and discharging process. One area where improvements are needed is in the area of battery failure detection.

Certain batteries, like lithium ion batteries (LIBs) have high specific energy and energy density among the different battery technologies, which makes them the ideal energy storage systems for electric vehicles (EVs) and hybrid electric vehicles (HEVs). To fully utilize LIBs in EV/HEVs, operation under 100% depth of discharge (DOD) is desired in order to achieve the highest utilization of their capacity and, consequently, their driving range (mile/charge cycle) and fuel economy (mile/gal). However, the current application of LIBs as energy storage systems in EVs and HEVs has not taken full advantage of their high specific energy and energy density because current EVs and HEVs operate between only 25 and 50% of the battery pack's capacity. This conservative operation (25-50%) provides a protection buffer to avoid unwanted cell degradation. However, such a buffer directly results in the reduction of the specific energy and energy density of a battery pack, and in the worst case, leads to an oversized battery system by as much as a factor of four and, consequently, a significant cost increase. Hence, operating the battery packs under/close to 100% capacity will take full advantage of the high specific energy and energy density of the LIBs and lead to the significant reduction of the cost of the battery pack in vehicle (EVs and HEVs) and other applications (stationary energy storage), which, in turn, will overcome the barriers for mass-market adoption of HEVs/EVs.

The high specific energy and energy density of LIBs are their great advantages for application in transportation. However, high energy density means packing a huge amount of energy in small volumes, which poses a safety hazard, in particular when high power is demanded for the LIB cells (i.e. acceleration of vehicle). High power usually requires high current, which in turn, causes excessive Ohmic heat generation inside a LIB cell and may cause fire or explosion. Even under the normal operating conditions, some LIB cells failed without any signs and caused significant loss or damage to the systems. The safety of LIB s is also critical for EV and HEV market adoption, as the premature failures in automotive batteries have already led to significant consumer dissatisfaction and cost hundreds of millions of dollars to consumer battery manufacturers in recalls and litigation. The failure of LIBs has a tremendous impact on EV and HEY market adoption and directly affects the cost and risk of deployment. Thus, a battery management system (BMS) with a function that can monitor the state of health of the LIB cells and predict incoming failure is needed More specifically, there is a need to determine battery failure in advance of an actual failure. An online monitoring system is needed that is capable of both detecting internal cell faults and issuing an accurate and reliable warning for incoming failure of cells/modules in a battery pack under certain operating conditions and driving cyles. The major challenges for such a system lie in the uncertainty (random occurrence) and unobvious signals associated with failure. Current empirical trial-error approaches often result in detection with very low sensitivity and specificity due to the lack of a fundamental understanding of the faults.

SUMMARY

Accordingly, apparatuses, systems and methods are disclosed for an early warning and monitoring configuration for battery cells and battery packs. During normal cycling of a battery, surface temperature, voltage, current and impedance may be monitored to determine if abnormalities exist in the battery and/or battery structure. The abnormalities may be advantageously detected using battery temperature characteristics, where the characteristics are subject to rule-based processing to determine impending battery failure. By receiving advance notice of failure, a warning signal may be transmitted to provide notice and/or allow corrective action to be taken. Additional characteristics, such as voltage and/or current may be used in conjunction with the temperature to detects and/or predict failure.

It has also been found that internal cell faults are at least partly rooted in the materials inside a battery cell, and the cause of fault or failure is due to changes in the physical structure and chemical composition of cell components. By utilizing signatures associated with failure, root causes of faults and fault detection may be determined with high sensitivity and specificity. Accordingly, improved fault detection may be implemented by applying a multi-stage, network-based approach to detecting and identifying cell-level, module-level, and pack-level faults and/or failure. This approach includes processing failure behavior data, identifying failure signatures, determining failure mechanisms, applying detection algorithms, and integrating the system. Additional information is provided in the Detailed Description, found below.

Thus, exemplary systems, apparatuses and methods of the present disclosure may be capable of detecting internal cell faults using online and real-time sensing techniques, and providing an accurate and reliable early warning for the incoming failure of LIB cells (hours or days prior to failure) in a battery pack using advanced detection technology and algorithms. This technology may be a standalone system or incorporated into a BMS. This technology may be realized through a system that can perform real-time and direct measurement of LIB cell parameters of temperature, voltage, and AC impedance through online sensing. These parameters may be simultaneously processed using advanced probabilistic and Fuzzy logic-based algorithms to provide an early warning for the incoming failure of LIB cells in a battery pack. This technology may safeguard the LIB battery packs while allowing them to operate at 100% capacity in both transportation and stationary applications, which will, in turn, result in the significant reduction of oversized packs and directly transform this reduction into cost savings, removing barriers for the market adoption of HEVs and EVs.

BRIEF DESCRIPTION OF THE DRAWINGS

The present invention is illustrated by way of example and not limitation in the figures of the accompanying drawings, in which like references indicate similar elements and in which:

FIG. 4A illustrates an exemplary thermal circuit used for detecting and/or predicting a battery failure condition;

FIG. 4B illustrates an exemplary process for determining a thermal model for use in detecting and/or predicting a battery failure condition;

FIGS. 5A-B are exemplary graphs illustrating temperature and voltage characteristics in a battery over-charge condition;

FIG. 5C-5D are exemplary graphs illustrating temperature and voltage characteristics in a battery over-discharge condition;

FIGS. 8A-D illustrate HESXRD patterns for a LiFePO$_4$ cell for charging cycles;

DETAILED DESCRIPTION

Figure 1:
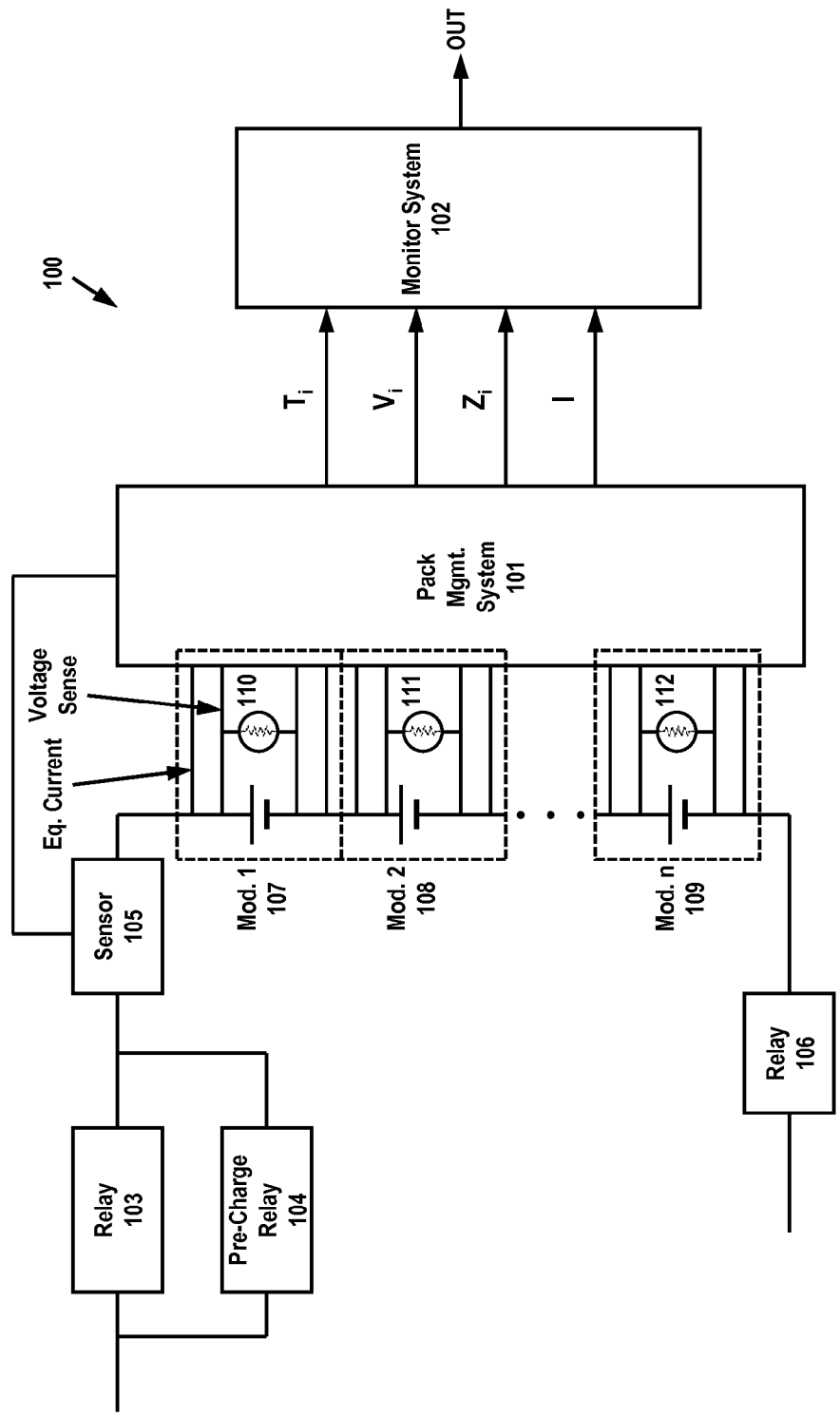
FIG. 1 illustrates an exemplary architecture for detecting battery operating conditions and processing the conditions to calculate and/or predict a failure condition in at least one of a plurality of batteries under an exemplary embodiment.

FIG. 1 illustrates an exemplary embodiment of a system 100 for detecting battery operating conditions and processing the conditions to calculate and/or predict a failure condition in at least one of a plurality of batteries. Under certain conditions, relays may be necessary to control voltage and current being delivered to the batteries. As illustrated in FIG. 1, relays 103 and 106 may be used to control the input of voltage to battery modules 107-109, along with pre-charge relay 104. When initially connecting a battery, there may be an inrush of current as the load is charged up to the battery voltage. With large batteries (with a low source resistance) and powerful loads, the inrush current can easily peak to dangerous levels. Pre-charge relay 104 (or an equivalent circuit) can limit the inrush current without necessarily limiting the operating current.

In addition to relays 103-104 and 106, a sensor 105 may be used to detect incoming current, and to provide the sensed current to pack management system (PMS) 101. In one embodiment, sensor 105 is a Hall Effect sensor capable of producing a voltage difference across an electrical conductor, transverse to an electric current in the conductor and a magnetic field perpendicular to the current. As will be apparent from the disclosure below, use of relays 103-104, 106 and sensor 105 is optional and is not critical to the present disclosure.

As is illustrated in FIG. 1, a plurality of battery modules 107-109 are operatively coupled to pack management system 101. Each battery module 107-109 is preferably coupled with a set of equalization current lines and a set of voltage sense lines, where a thermostat (110-112) is connected across each voltage sense line, shown in FIG. 1, for temperature-measurement purposes. Each battery module 107-109 (or "cell") is indexed to provide individual measurements to PMS 101 that are forwarded individually to monitor system 102. Exemplary measurements include internal battery temperature $T_i$, battery voltage $V_i$, impedance $Z_i$ and current I. Monitor system 102 processes these measurements and provides and output (OUT) which may be utilized to determine a state-of-health (SoH) or warning of a failure condition.

Figure 2:
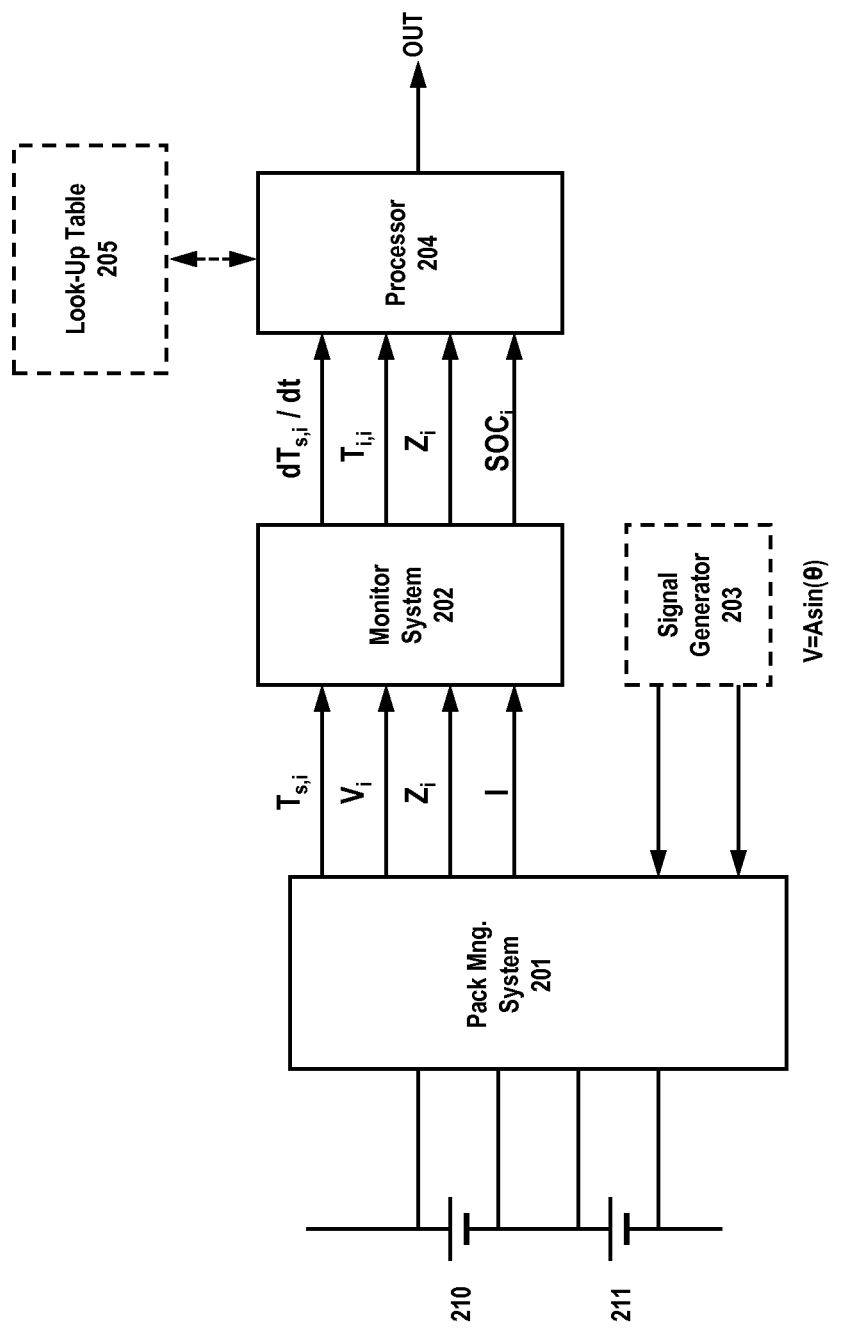
FIG. 2 illustrates another exemplary architecture for detecting battery operating conditions and processing the conditions to calculate and/or predict a failure condition in at least one of a plurality of batteries under an exemplary embodiment.

Turning to FIG. 2 another exemplary system is illustrated, where PMS 201 and monitor system 202 may be similar to that illustrated in FIG. 1. Here, measurements from each of a plurality of battery cells 210, 211 are provided to PMS 201, where PMS outputs measurements that include, for each cell i, skin temperature ($T_{s,i}$), battery voltage $V_i$, impedance $Z_i$ and current I. In one embodiment, impedance may be measure using a signal provided by signal generator 203, where the signal may be a sine wave with a voltage amplitude of ≤5 mV at different frequencies. In other embodiments, signal generator 203 is not used, and impedance is calculated in monitoring system 202 from the other measurements provided by PMS 201, discussed in greater detail below. After receiving $T_{s,i}$, $V_i$, I, and alternately from PMS 201, monitor system 202 processes these inputs to determine, for each cell i, a temperature differential ($dT_{s,i}/dt$), an internal temperature ($T_{i,i}$) impedance ($Z_i$), and a state-of-charge ($SOC_i$). Generally speaking the state-of-charge may be defined by $$SOCi = \int_{t=0}^{\tau=t} I\, dt$$

and wherein internal temperature may be defined as $T_i=T_s+\Delta T$. Internal temperature for each cell ($T_{i,i}$) may be used to define rules for determining a failure condition, where the temperature is based on a number of characteristics including decomposition temperatures of a battery electrolyte ($T_e$), anode ($T_A$), cathode ($T_C$), separator ($T_S$) and/or solid-electrolyte interphase (SEI) ($T_{SEI}$). These and other factors have been found to be highly indicative of pending and/or actual fail conditions. Battery failure under normal cycling conditions can be tied to over-charge or over-discharge due to capacity in the balance. It has been observed that the structural changes of anode and cathode materials and decomposition of the electrolyte under normal cycling conditions contribute significantly to battery failure and are linked to temperature.

Turning briefly to FIGS. 5A-B, an exemplary graph is provided, illustrating the relationship of voltage (V) and temperature (T) during an over-charge condition for a (LiFePO4) battery. Here, a 10% overcharge and 110% SoC resulted in a relatively quick battery failure, where failure was observed after 8-10 cycles. Typically, for a given battery pack, cells above 95% are seen as experiencing overcharge, while cells below 95% are seen as experiencing over-discharge. As can be seen from FIGS. 5A and 5B, the battery voltage starts to increase slightly over time until failure (indicated by arrow in FIG. 5B). However, the temperature increases by a much greater degree (FIG. 5A) until failure ultimately occurs. During overcharge, it has been observed that iron (Fe) may become oxidized on the cathode, and $Fe^{3+}$ becomes reduced to $Fe^{2+}$, followed by the Fe on both the cathode and the anode. As such, an Fe bridge forms during cycling, resulting in a short.

FIGS. 5C and 5D illustrate a failure during an over-discharge condition, where it can be seen that the end temperature rises considerably with the cycle number. At the end of the over-discharge, a sharp temperature rise can be observed, which typically accompanies a capacity decrease in the battery resulting from the internal short. Also, the anode potential may become very positive during over-discharge. Here, copper (Cu) foil becomes oxidized on the anode at the end of over-discharge due to the reversal of the anode potential. Cu becomes reduced for the cathode at the end of over-discharge, resulting in a Cu bridge (short) between the cathode and anode, resulting in failure. From the above, it can be surmised that, for cells operating under normal charge/discharge cycles, the cause of failure can usually be linked to the degradation of electrodes and electrolytes.

Turning back to FIG. 2, monitor system 202 may calculate the internal temperature of each of the i battery cells according to $T_{i,i}=T_{s,i}+\Delta T=h(I, T_s, SoC)$ at different I, $T_s$, and SoC. Impedance $Z_i$ and temperature differential ($dT_{s,i}/dt$) may also be calculated in monitor system 202 at different I, $T_s$, and SoC as well. These calculations are then provided to processor 204 to determine if a battery fail condition may exist. Under one embodiment, processor 204 evaluates, for each cell, the temperature $T_{i,i}$ temperature differential $dT_{s,i}/dt$, and impedance $Z_i$ by comparing the measurements to a look-up table 205 according to a set of rules to determine failure(s) or if a failure is about to occur. Look-up table 205 preferably comprises values based on charge/discharge capacities (e.g., 0.1 C, 0.5 C, 1 C, 2 C, etc.) correlated with different temperatures (e.g., 0° C., 5° C., 10° C., 15° C., etc.). Processor 204 preferably weighs the severity of different failures based on temperature $T_{i,i}$, temperature differential $dT_{s,i}/dt$, and/or impedance $Z_i$, and if the comparison for any of these factors exceed a predetermined threshold, processor 204 transmits a warning signal for the cell and pack to a system controller, indicating a severity level or SoH.

When utilizing rule-based failure detection, a variety of rules may be implemented for detecting failure based on battery capacity and temperature. For example, a basic rule-based failure detection algorithm may be structured for 2 C over-discharge at room temperature (e.g., 23° C.). The rule for this example may be configured to take into account charging after an over-discharge, where (a) an unusual increase in temperature would indicate impending failure, and/or (b) an unusual decrease of voltage would indicate impending failure. Thus, for each time period, $T_{s,i}$, $V_i$, and $I_i$ would be captured in real-time. Next, a first rule ("Rule I") for the temperature could be defined by setting voltage and current parameters for each cell (e.g., $V_i<2$ and $I_i\leq0$). When either or both parameters are met, a local maximum cell surface temperature ($T_{s\_max}$) is initialized and the actual $T_{s,i}$ data is compared to the maximum ($T_{s\_max}$). If $T_{s,i}>T_{s\_max}+\delta_T$, where $\delta_T$ is the temperature threshold, processor 204 may transmit a warning signal. A second rule ("Rule II") could be set for voltage decrease by determining if $I_i>0$, a voltage determination, defined by $V_{i-k}-V_i>\beta_V$ would take place. Here, k is the period offset used to eliminate the influence of noise, while $\beta_V$ is the voltage threshold. If $V_{i-k}-V_i>\beta_V$ is met, processor 204 would transmit a warning signal.

Figure 6A:
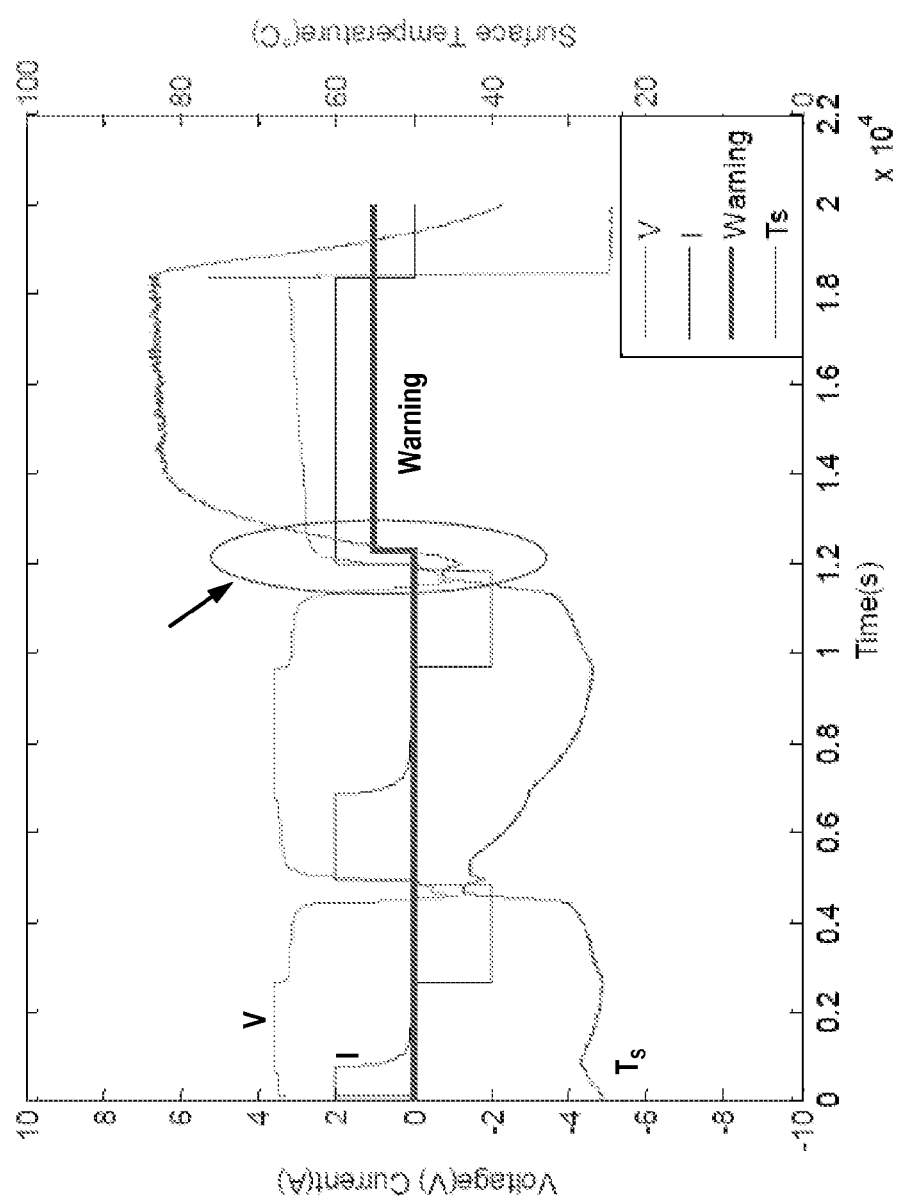
FIGS. 6A-6C are exemplary graphical illustration of battery failure conditions based on a plurality of rule-based determinations.
Figure 6B:
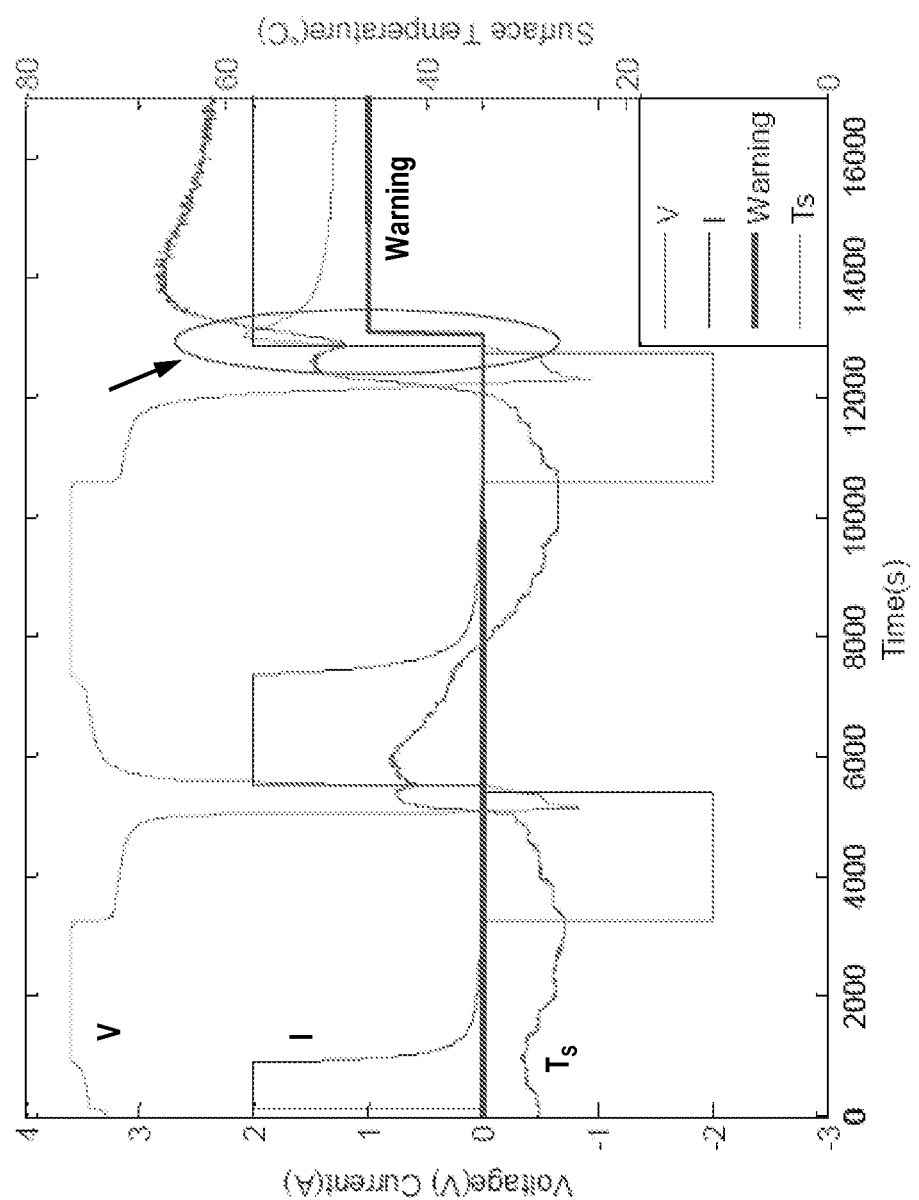
Figure 6C:
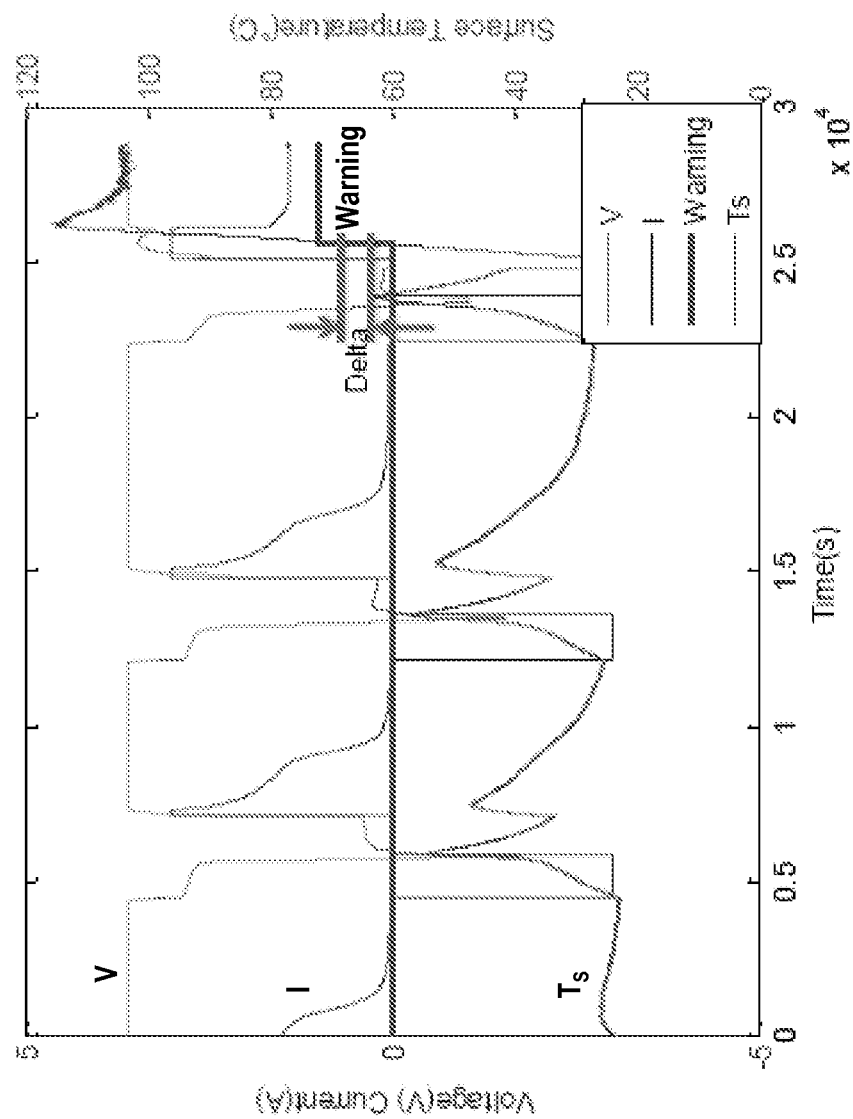

FIG. 6A provides a graphical illustration of the issuance of the warning signal for a 2 C overcharge according to Rule I, based on voltage (V), current (I) and temperature ($T_s$) over time. As can be seen from the figure, when the voltage drops below 2, the current is less than or equal to 1, and the temperature exceeds the given threshold, the warning signal is triggered. FIG. 6B provides a graphical illustration of the issuance of a warning signal for a 2 C overcharge according to Rule II, based on voltage (V), current (I) and temperature ($T_s$) over time. As can be seen from the figure, as $I_i>0$ and voltage threshold are reached, the warning signal is triggered. FIG. 6C is a graphical illustration of voltage (V), current (I) and temperature ($T_s$) according to Rule I, except that a 3 C over-discharge basis is used for triggering the warning signal.

Figure 3:
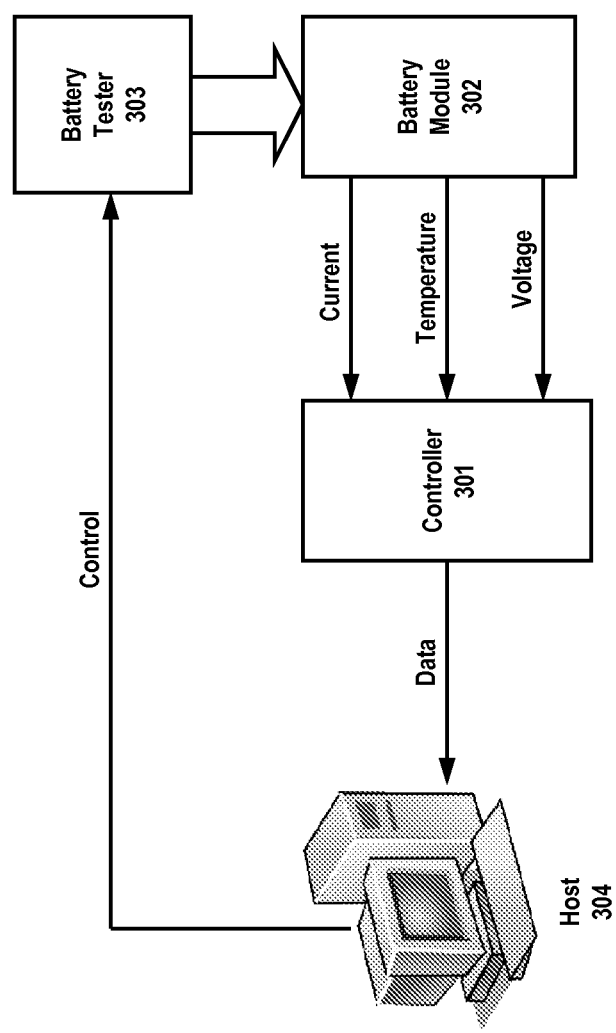
FIG. 3 illustrates an exemplary system configuration for detecting and/or predicting a failure condition in at least one of a plurality of batteries.

Turning to FIG. 3, an exemplary configuration is provided for testing batteries to determine battery characteristics used to set failure profiles for different types of batteries. The failure profile may include threshold values based on voltage, current, impedance and temperature. Threshold values set from the system in FIG. 3 may then be used for triggering warning signals on other systems, discussed above. Of course, it is understood that the battery testing, measurement and transmission of warning signals may all take place within the system of FIG. 3 as well.

Battery tester 303 is used to hold the battery cells from battery module 302 and provide test data to controller 302. A suitable battery tester for this purpose includes Arbin BT2000 Battery Testing System, which is a multiple independent-channel testing system, where each channel operates independently of the others, enabling users to run tests on multiple batteries at the same time. Battery tester 303 may be used to generate battery charging and discharging cycles in order to provide current temperature and voltage measurements to controller 301. Under one embodiment, controller 301 comprises a control rack operatively coupled to a controller that provides data communication to host computer 304. Host computer may provide control and/or warning signals back to battery tester 303. An exemplary controller suitable for operation in FIG. 3 includes National Instruments CompactRIO reconfigurable embedded control and acquisition system, whose architecture includes I/O modules, a reconfigurable field-programmable gate array (FPGA) chassis, and an embedded controller. Additionally, CompactRIO is may be programmed with NI LabVIEW graphical programming tools (via host 304) to provide further embedded control and monitoring applications, if needed. Additional peripherals suitable for battery measurements in controller 301 may include NI 9213 16-channel thermocouple input module for temperature measurements, NI 9206 16-Ch, 16-bit, analog input module, and NI 9227 4-channel current input "C Series" module. It is understood by those skilled in the art that other or additional peripherals and devices may be used for battery measurement and control without deviating from the scope of the present disclosure.

Depending on the type of measurements being taken, different models may be used for calculating impedance (discussed above in connection with FIGS. 1 and 2) or internal battery temperature for failure condition analysis. Turning to FIG. 4A, an exemplary model circuit is disclosed for employing electrochemical impedance spectroscopy (EIS) to determine model structure and parameters of a battery. In accordance with this model, it is presumed that all battery failures may be traced to characteristics and structures contained in a battery (e.g., cathode, anode, separator, electrolyte, can/terminal, safety vents, etc.). Under normal cycle, it has been found that capacitance slowly decays, and internal impedance rises as the cycle number increases. Additionally, the temperature of end discharge increases with the cycle number.

Each battery may be modeled as having a high-frequency inductance (L) set in series with the ohmic resistance from an electrode, electrolyte, separator and connection. This resistance ($R_0$) may represent the internal resistance of the battery, including the separator resistance and all the contact resistance. The Solid Electrolyte Interface (SEI) layer of the battery is important for the stability of secondary cells in the battery, and typically employs carbon anodes. The electrolyte reacts with the carbon anode during the initial formation charge and a thin passivating SEI layer builds up moderating the charge rate and restricting current. The SEI layer may also increase the cell internal impedance and reduce the possible charge rates as well as the high and low temperature performance. Excessive heat can cause the protective SEI barrier layer to beak down allowing the anode reaction to restart releasing more heat leading to thermal runaway. The thickness of the SEI layer is not homogeneous and increases with age, increasing the cell internal impedance, reducing its capacity and hence its cycle life.

The capacitance $C_{sei}$ and resistance $R_{sei}$ of the SEI layer is taken into consideration in the model as shown in FIG. 4A. While not expressly shown, the capacitance of the interface between the SEI layer and mesocarbon microbead (MCMB) may also be used. Additionally, the double-layer capacitance $C_{dl}$ and charge-transfer resistance $R_{ct}$ is included in the exemplary circuit model, where charge-transfer resistance $R_{ct}$ is set in parallel to the double-layer capacitance $C_{dl}$, together with the battery's Warburg diffusion impedance $W_d$, shown in FIG. 4A. Typically, charge transfer resistance $R^{ct}$ is smaller than $R_{sei}$, where Li$^+$+MCMB$\leftrightarrows$Li+ MCMB. Accordingly, the model of FIG. 4A may be expressed as $R_0(C_{sei}R_{sei})(C_{dl}(R_{ct}W_d))$. It is understood by those skilled in the art that other models similar to FIG. 4A may be used without deviating from the scope of the present disclosure.

For modeling temperature to determine and/or predict battery failure, surface temperature, current, and voltage of the battery while it is being both charged and discharged may be monitored. The presently disclosed system is capable algorithmically monitoring any of such characteristics and output an internal temperature. One technique for determining internal temperature involves the use of Fourier's Law under given constants, including the thermal resistances of the various materials and the heat generation at different currents. In the case of lithium ion batteries, they make good power storage devices, however they offer significant risks in certain situations. When a battery is over-charged or over-discharged, it produces significant heat. If the battery isn't properly monitored, there is the possibility of an explosion. It was discovered that one of the better ways to predict danger is through observation of the internal temperature. The surface temperature can be measured and the heat generation can be calculated using thermal resistance; knowing the thermal resistance of the battery is advantageous to understanding how the battery behaves while it charges and discharges.

In order to accurately find the thermal resistance of a battery, the path of the heat needs to be considered. A battery typically comprises multiple sheets wrapped into a spiral and pressed into a casing. These layers consist of the anode, cathode, and two separator layers. The heat has the option of passing through the layers radially, or it can follow them tangentially. The anode and cathode are sheets of low resistance metals coated with relatively high resistance substances. This causes the majority of the heat to travel through the metal around the battery rather than passing through the coating.

FIG. 4B illustrates an exemplary analytical thermal system model, that is generally governed by $\Delta T = T_s - T_i = (q_{chem} + q_{elec})R_{tot}$, where $T_s$ is the battery surface temperature, $T_i$ is the battery internal temperature, $q_{chem}$ is the heat flux due to ohmic heat, $q_{elec}$ is the heat flux due to all other heat sources that are determined analytically or experimentally, and $R_{tot}$ is the total thermal resistance of a cell. In general terms, $q_{elec}$ may be expressed as $q_{elec} = VI$ while $q_{chem}$ may be expressed as $q_{chem}=f(I, V, T_{am}, SoC_t)$, where $T_{am}$ represents ambient temperature and $SoC_t$ represents a state-of-charge for a given time.

Current is provided to integrator 403 where a state-of-charge (SoC) or depth-of-discharge (DoD) may be calculated. The SoC/DoD is provided to heat flux $q_{elec}$ calculation module 401 and ohmic heat flux $q_{chem}$ calculation module 404. The heat flux $q_{elec}$ calculation module 401 also receives as an input voltage (V) and temperature $T_a$. Using the voltage, current and SoC/DoD from 403, module 401 processes the values using an open-circuit potential curve 402 to determine $g_{elec}$. The open circuit (OC) potential may be regarded as the potential of the working electrode relative to a reference electrode when no potential or current is being applied to a cell. Generally, when a potential is applied relative to OC, the system measures the open circuit potential before turning on the cell, then applies the potential relative to that measurement.

The ohmic heat flux $q_{chem}$ module also receives current (I), SoC/DoD from integrator 403, and further receives $q_{chem}/I$ Curve from 406 to perform curve fitting for that calculation of $q_{chem}$. Curve 406 generally relates to a temperature-DoD curve, illustrated in FIG. 4B. While the thermal model is a function of several factors ($\Delta T=T_s-T_i=(q_{chem}+q_{elec})R_{tot}$), internal temperature $T_i$ is of particular interest. Using measured surface temperature $T_s$, $R_{tot}$ may be calculated using already calculated $g_{elec}$ provide by 401. If $q_{chem}$ is known to be an equation, $T_i$ may be calculated using the thermal model. However, $q_{chem}$ is typically a complex function, and may be difficult to calculate. Therefore, the curve fitting of 405 may be advantageously applied by using measured data from temperature-DoD, and fit the curve with knowing $T_i$ to get $q_{chem}$. Once calculated, $q_{chem}$ is summed with $q_{elec}$ to provide overall heating $q_{heating}$. Using a thermal resistance $R_{th}$ value, module 406 calculates a delta for the temperature ($\Delta T$). The $\Delta T$ value is then summed with a battery surface temperature $T_s$ to provide an internal battery temperature $T_i$ which may be used to detect and/or predict battery failure.

As can be appreciated from those skilled in the art, temperature is not the only parameter associated with failure. Generally speaking, "failure" as used herein may be defined as the inability of taking charges or delivering charges. In other words, a cell cannot be charged or discharged. The causes for failure in the LiFePO4 cells may be attributed to overcharge conditions, and cell failure is due to an internal short caused by micro-shorting from the formation of an iron bridge. During over-discharge conditions, the micro-shorting is from the formation of a copper bridge, discussed above.

Other parameters of cells such as voltage (V), state of charge (SoC), internal temperature ($T_i$), cell surface temperature differential ($dT_s/dt$), and AC impedance ($Z_i$) can also serve as parameters for monitoring the state of health and detecting the failure of a cell. Profiles for SoC, voltage, and AC impedance may also be modeled to determine failure. However, the use of a parameter as a failure indicator depends on whether the parameter is easily measured or computed, the response is fast enough, and the accuracy is high enough. The detection algorithm using temperature as the failure signature has been successfully developed and validated.

AC impedance may also be used to detect failure on both single cell and battery pack with multiple cells. Using an LIB cell equivalent circuit model (FIG. 4A), the measured AC impedance can be de-convoluted into different components such as the resistance ($R_{SEI}$) and the capacitance ($C_{SEI}$) of solid electrolyte interface (SEI), double layer capacitance ($C_{dl}$), and charge transfer resistance ($R_{ct}$), which corresponds to different physical processes in a LIB cell during charge/discharge. AC impedance may provide comprehensive information about the LIB cell, and it can be used as an effective technique for monitoring the state of health and detecting the incoming failure of LIB cells, modules, and packs. Each LIB cell or battery module in a battery pack typically has voltage leads to measure the voltage of the cell or module. Hence, the cell/module voltage is easy to measure, and the voltage can be used as a parameter for failure detection.

In other embodiments, techniques are disclosed for detecting internal cell faults using online and real-time sensing and providing an accurate and reliable early warning for the incoming failure of LIB cells (hours or days prior to failure) in a battery pack using advanced detection technology and algorithms. The embodiments may be embodied as a standalone system or incorporated into a battery management system (BMS). Under a preferred embodiment, the system utilizes real-time and direct measurement of LIB cell parameters including temperature, voltage, and AC impedance, and performs sensing online. Measured parameters may be simultaneously processed using advanced probabilistic and Fuzzy logic-based algorithms to provide an early warning for the incoming failure of LIB cells in a battery pack. Such a configuration may advantageously safeguard battery packs while allowing them to operate at 100% capacity in both transportation and stationary applications, which will, in turn, result in the significant reduction of oversized packs and directly transform this reduction into cost savings, removing barriers for the market adoption of HEVs and EVs. It is understood by those skilled in the art that, while certain embodiments are described using lithium-ion batteries, the techniques described herein are equally applicable to similar batteries and battery structures as well (e.g., LiFePO4, LiNiMnCo, etc.).

As mentioned previously, internal faults/failures for batteries may be rooted in the materials (and changes in these materials) inside LIB cells. Under the present disclosure, a multi-step approach is utilized for identifying such faults/failures. First, the failure behavior/modes of an LIB cell is determined at different operating conditions, and signatures associated with the failures are identified and formed. Subsequent measurements are taken of similarly situated cells to detect the presence of signals/signatures online and in real-time, where the measurements are processed to issue warning signals for incoming failure in LIB cells in a battery pack. The detection and decision algorithms are preferably integrated into hardware to form a detection system.

Figure 7A:
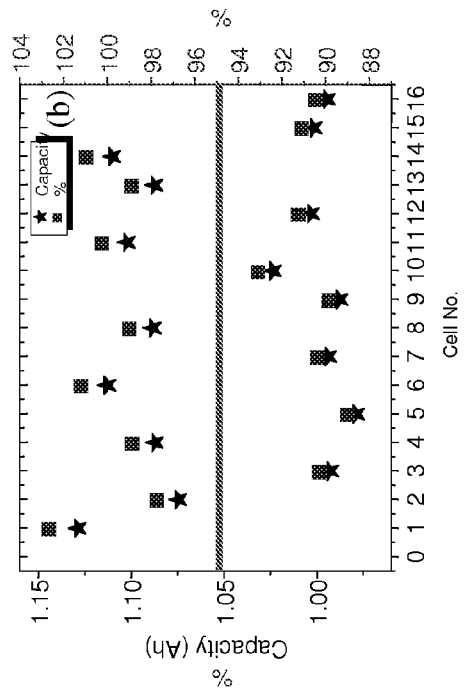
FIGS. 7A-C illustrate capacity distribution for overcharge/discharge condition, and measuring times corresponding to different parameters.
Figure 7B:
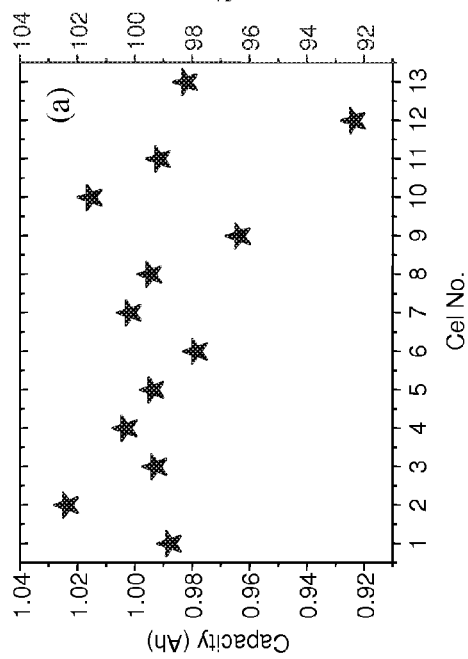

Regarding the failure behavior/modes of LIB cells at different operating conditions, it is advantageous to build a failure database that is based on repeatable and reproducible measurements. Under one embodiment, failures may be based on a small degree of overcharge and over discharge, preferably at a constant current. In order to create failure in a controlled way, a small degree (e.g., up to 20%) of overcharge/over-discharge is used to induce LIB cell (or module or pack) failure. It has been found by the inventors that an approximate 12% capacity variation may exist for pristine cells (FIG. 7A), and that the capacity variation may increase to 15% after 300 cycles (FIG. 7B) for cells that were individually cycled. This is very similar to a battery module with multiple cells, in which the nominal state of charge (SOC) of the module with multiple (e.g., 13) cells is assumed to be 95%. Those cells with a SOC more than 95% may experience overcharge with a maximum of 8% SOC, while cells with a SOC below 95% experience over-discharge with a maximum of 8% SOC when the modules run under apparently normal charge/discharge cycles with 95% SOC. For battery modules in a battery pack, a similar behavior happens. This capacity band will broaden with cycle number and, eventually, the capacity of the battery pack will be limited by the module with the lowest capacity (assuming all modules in series configuration). In FIG. 7A, the capacity distribution of 13 cells is illustrated after a $2^{nd}$ cycle, while FIG. 7B illustrated the capacity distribution after the $300^{th}$ cycle. In this example, constant current charge/discharge is applied, with 1 C rate and 100% DOD. Thus, the lowest capacity module will experience over-discharge, even if the whole pack is experiencing normal charge/discharge cycles. With a battery pack management system (BPMS), the capacity band of a battery pack can be controlled within a range, but the band cannot be eliminated. For example, at the end of charge of a battery pack with 13 Ni-MH battery modules (SAFT NH12.2, 96 Ah), a 3% capacity variation may exist. When a BPMS is used to control the capacity variation, the variation at the end of charge may be narrowed to 2%.

Thus, overcharge and over-discharge exists in battery modules for cells and in battery packs for modules. Accordingly, the overcharge and overdischarge may be used as tools to create failures. In one embodiment, the degree of overcharge/overdischarge may be limited to 20%. The reason for choosing 20% in this embodiment is that battery packs may have a BPMS to manage the battery modules and minimize the capacity variation, and 20% capacity variation should be enough to represent a worst case scenario.

In any event, the exemplary fault detection system based on a 20% capacity embodiment should respond to other situations, even ones having more than 20% capacity, because the signals may be much stronger over 20%. The inventors analyzed LifePO4 cells (APR18650M 1 A 3.3V 1100 mAh, A123 Systems) at 10% overcharge for a constant charge/discharge cycle, and found cell failure occurring after 9 cycles, where the cells lost the capacity for charging and discharging. It is worth noting that the temperature of the cell also increased with cycle number, and this feature may also be used as a signature of the failure. The inventors also analyzed 5, 10, 15 and 20% overcharges (by Coulombs) for LifePO4 cells, and found that all showed similar failure patterns, and the cycle life decreased as the overcharge percentage increased. Different over-discharges were also analyzed for the LiFePO4 cells, as they represent some of the worst scenarios, and the results can be used to provide a safeguard to the battery packs operating under full capacity. Here, the LifePO4 cells (APR18650M 1 A 3.3V 1100 mAh, A123 Systems) were cycled for 10% over-discharge (by Coulombs), and it was found that cells failed after 8 charge/over-discharge cycles. Similarly, the temperature of the ending discharge increased with cycle number until failure. The effect of degree of over-discharge was found to be similar as that of overcharge.

Regarding failures from driving cycle, DOE driving cycles may be used to determine failure behavior. Cell temperature profiles may also be used during the driving cycle to determine if the cell skin temperature is suitable as a failure signature. AC impedance may similarly be used to monitor cell failure.

In order to identify signatures associated with the failures, cell temperature ($T_{cell}$) and voltage ($V_{cell}$) can be used as failure signatures in cells experiencing overcharge and over-discharge. As mentioned previously, AC impedance may also be used as a detection method for cell faults, where derivative parameters from AC impedance may form the base of the failure signatures. Under the AC impedance embodiment, an AC sine wave signal is applied to a LIB cell (e.g., 5 mV amplitude, using a frequency from 0.01 MHz to 10 KHz). The cell response is measured and obtained impedance (Z) is plotted as the imagery impedance vs. the real impedance. Using an equivalent circuit model (see FIG. 4A, above), the measured impedance may be deconvoluted into different components that represent different physical and chemical processes inside LIB cells. It has been found that contact resistance ($R_O$) and solid electrolyte interface resistance ($R_{SEI}$) gradually increase with cycle number and rapidly increase when the cell is close to failure. Hence, both $R_O$ and $R_{SEI}$ can be used as signatures for failure detection.

AC impedance is particularly useful for monitoring the state of health of LIB cells in the process of long term normal cycling because the change of other parameters (i.e. cell voltage and temperature) may not be significant enough for detecting. During long term cycling, LIB cell components (i.e. electrodes, electrolyte, solid electrolyte interface, etc.) gradually degrade, which causes the performance to decay. The AC impedance method can provide abundant information about the physical structure and the chemical composition of these components including but not limited to the double layer ($C_{dl}$), the solid electrolyte interface ($C_{SEI}$ and $R_{SEI}$), the charge transfer ($R_{ct}$), the diffusion process ($W_d$), and the contact resistance ($R_O$)).

Figure 7C:
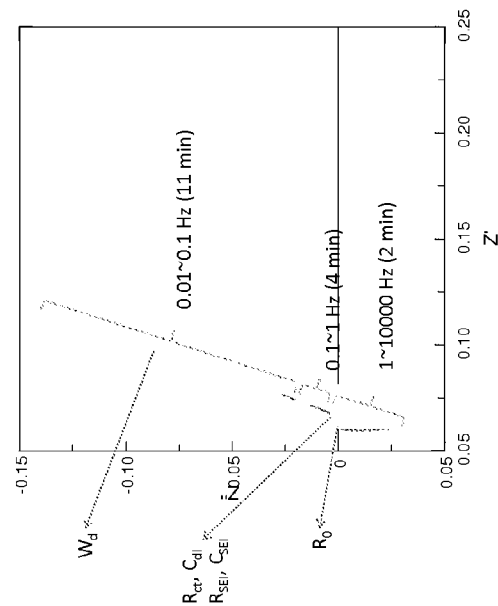

The time for running full spectrum AC impedance (e.g., frequency range: 0.01 to 1.0 MHz) for a LIB cell under conventional circumstances, may take 17 minutes or longer, which may be unacceptable for real-time monitoring because the cell may change its physical structure and chemical composition significantly during this period, and this further cannot provide a rapid response. By performing analysis processing for the different components with frequency ranges shown in FIG. 7C, it can be seen that the measuring time for obtaining the major parameters for the failure warning/prediction (contact resistance ($R_O$), solid electrolyte interface resistance ($R_{SEI}$), solid electrolyte interface capacitance ($C_{SEI}$), double layer capacitance ($C_{dl}$), and charge transfer resistance ($R_{ct}$)) can be shorted by up to 2 minutes, which makes AC impedance feasible for online monitoring.

Preferably, AC impedance results are not taken from direct measurements, but from the derivative and secondary parameters through AC impedance data deconvolution. Accordingly, validation of the AC impedance results may be required, which may be done by confirming whether $R_O$ and $R_{SEI}$ of AC impedance results are valid signatures and not artificial signals. In addition, for LIB cells experience long term cycling, it may be advantageous to utilize high-energy synchrotron x-ray diffraction (HESXRD) to do in situ (real-time) monitoring of the physical structure changes of a LIB cell. The HESXRD results of the physical structure changes of the electrode materials may be converted into diffusion coefficients. This embodiment is based on the hypothesis that the crystal structure of both the anode graphite and the cathode LiFePO4 or LiNiMnCo will experience expansion/contraction corresponding to the Li+ ion insertion and de-insertion process (charge/discharge), which causes some lattices of electrode materials to collapse during the cycling of a LIB cell. This lattice collapsing could lead to the increase of a diffusion barrier for Li+ ion diffusion in the solid electrode of the anode and cathode, reflected by the decreased Li+ ion diffusion coefficients in the anode and cathode. In another embodiment AC impedance data, which is measured during the cycling test, may be converted to Li+ ion diffusion coefficients, where these two sets of diffusion coefficients are compared to see if a correlation between the two methods can be established.

For the HESXRD embodiment, in situ characterization of the LIB cells for the structure and chemical composition of cell components under different operating conditions, including the long-term life cycling, are performed (e.g., beamline 11-ID-C). In one embodiment, a high energy beam (e.g., 115 keV photons at the beamline 11-ID-C) is used to penetrate through the LIB cell stainless steel case, then penetrate through bulky samples, and diffract to a two-dimensional (2D) large area detector to form characteristic diffraction patterns of all materials inside the LIB cell. The 2D diffraction patterns can be converted to conventional one-dimensional (1D) XRD patterns, which can be analyzed to determine the structure of each component and their simultaneous changes and evaluate the associated chemical and physical properties. One particular advantage of HESXRD is that the high-energy beam allows for an in situ probing structural evaluation of active materials in bulk samples in real time and realistic conditions. The HESXRD may be used to characterize LIB cells for both short term testing (e.g. overcharge or overdischarge) and long term testing (e.g. driving cycles) to evaluate the structure and chemical composition of cell components during the testing.

In another embodiment, the HESXRD may be used to evaluate the effects of the structural changes of the electrode (i.e. graphite anode, LiFePO4, and LiNiMnCo cathodes) on LIB cell performance. This configuration may take advantage of phenomena where the lattice of graphite or metal oxides will collapse after long-term cycling due to the lattice experiencing the cycle of expansion/contraction from Li+ ion insertion/de-insertion (corresponding to charge/discharge), which in turn, will cause an increased diffusion barrier, consequently leading to a lower value of the Li+ ion diffusion coefficient in solid electrodes. This lower value will directly result in a lower discharge current density and namely, a lower power capability.

In this embodiment, the first charge/discharge cycle (or driving cycle) will be run while the XRD spectrum is being measured simultaneously. Then, the LIB cells may be run for a multitude of cycles (e.g., 250) and compared again the HSEXRD beamline to establish an in situ characterization. This process may be repeated at the 500th, 750th, 1000th, and 1500th cycle until the cell fails. In this way, the crystal structure changes of the electrode materials (i.e. graphite, LiFePO4, and LiNiMnCo) in the process of life cycling may be characterized to monitor the degradation of the electrode materials and identify the signatures associated with the failure under a long-term operating profile. Exemplary results for A123 18650 LiFePO4 cells are illustrated in FIGS. 8A-D, in which the main peaks of LiFePO4/FePO4 can be clearly identified. The expected diffraction peaks at 2θ=1.21°, 1.44°, 1.78°, 2.06°, 2.21°, and 2.47° correspond to the (200), (101), (111), (020), and (311) reflections of the LiFePO4; the peaks at 2θ=1.25°, 2.11° 2.27°, and 2.53° were the (200), (020), (301), and (311) reflections of the FePO4.

Figure 9:
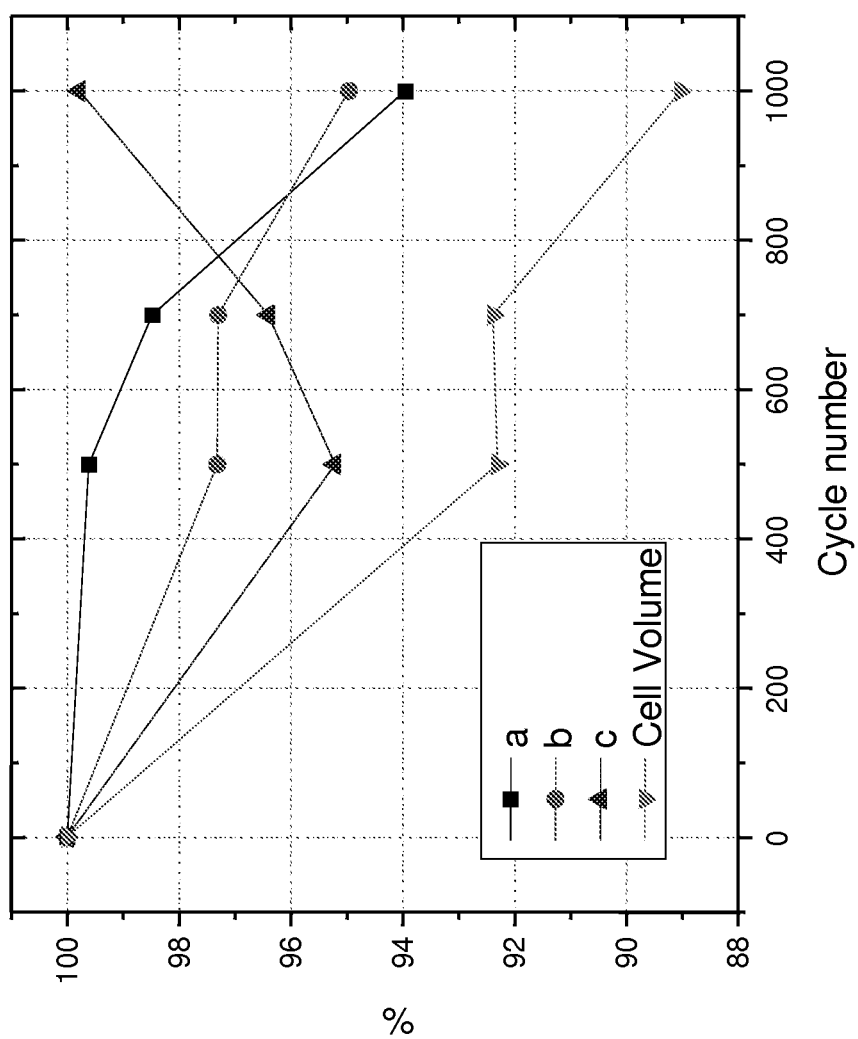
FIG. 9 illustrates exemplary lattice parameters and unit cell volume as a function of cycle number.
Figure 10:
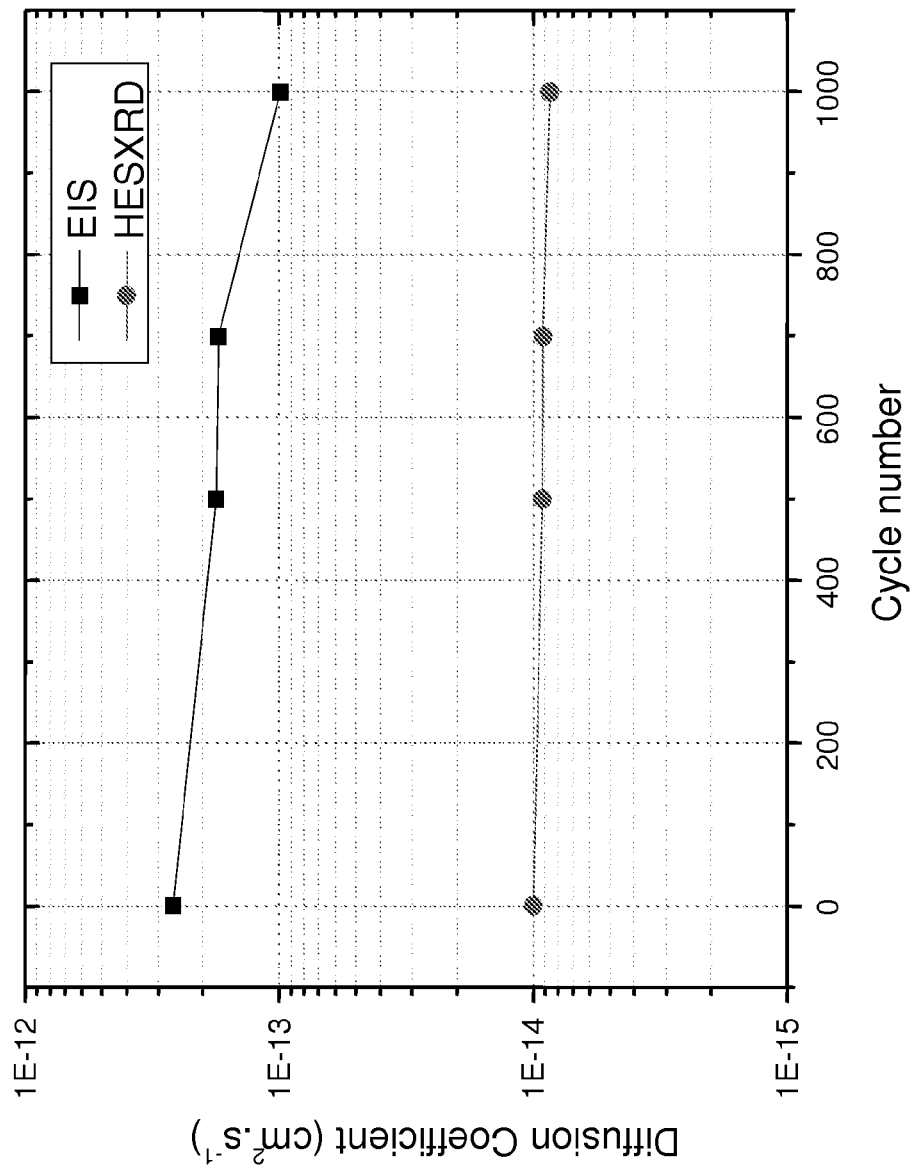
FIG. 10 illustrates Li$^+$ ion diffusion coefficient ($D_{Li+, LiFePO4}$) for different cycle numbers in a LiFePO$_4$ cathode using lattice parameters in FIG. 9.

From those reflections, the lattice parameters and their changes may be determined for both LiFePO4 and FePO4 during the charge/discharge process. The observed lattice parameters a, b, c, and unit cell volume are shown in FIG. 9 as a function of cycle number. Then, a model may be applied to calculate the Li+ ion diffusion coefficient ($D_{Li+,\ LiFePO4}$) in the LiFePO4 cathode using the lattice parameters in FIG. 9; exemplary results are shown in FIG. 10. An exemplary model may be based on Li+ ion diffusion through the radius direction from the surface to the center of a solid sphere, and the lattice volume of LiFePO4 is incorporated into the model. Using Fick's Law for diffusion in a sphere $$\frac{\partial c}{\partial t} = D\left(\frac{\partial^2 c}{\partial r^2} + \frac{2}{r}\frac{\partial c}{\partial r}\right) \quad (1)$$

for a non-steady state diffusion with constant surface concentration, we have the solution as below:

$$c(r,t) = c_s - (c_s - c_0)\frac{a}{r}\sum_{n=0}^{\infty}\left\{\mathrm{erfc}\frac{(2n+1)a-r}{2\sqrt{Dt}} - \mathrm{erfc}\frac{(2n+1)\alpha+r}{2\sqrt{Dt}}\right\} \quad (2)$$

where $c_s$ is the surface concentration, $c_0$ the concentration of sphere center, and $\alpha$ the radius of the sphere. The mean value of concentration can be expressed as $$c_{mean}(t) = \frac{\int_0^\infty c(r,t)4\pi r^2 dr}{\frac{4}{3}\pi a^2} \quad (3)$$

Since the cathode crystal structural data from HESXRD is the average measurement of all lattice unit cells in the cathode, then the average concentration of Li+ ion can also be expressed as the amount of Li+ ion in the lattice unit cell volume:

$$c_{mean}(t) = \frac{\alpha\delta}{VN_A} \quad (4)$$

where $\delta$ is the amount of $Li^+$ ion in the lattice unit cell, V is the cell volume, which can be obtained from HESXRD results, and $N_A$ is Avogadro's number. Through this model, the HESXRD data may be translated into the $Li^+$ ion diffusion coefficient ($D_{Li+,\ LiFePO4}$) in the LiFePO4 cathode and correlate this $D_{Li+,\ LiFePO4}$ with the IB cell performance. Thus, the HSEXRD may be used as a non-intrusive tool for monitoring not only the physical structure and chemical composition of electrode, but also the LIB performance.

Figure 11:
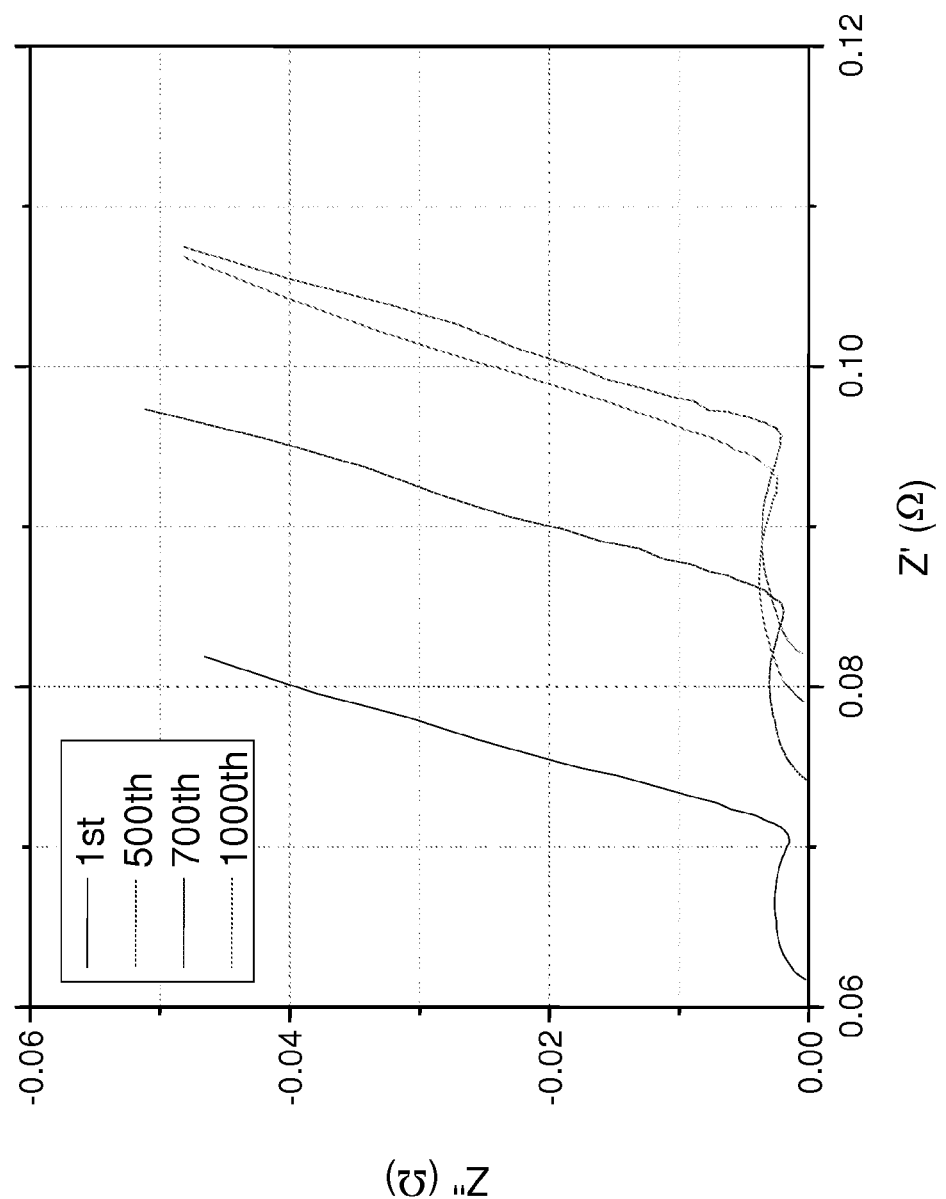
FIG. 11 illustrates AC impedance of different battery cycles.

In order to validate the AC impedance detection, the $Li^+$ ion diffusion coefficient ($D_{Li+,\ LiFePO4}$) may be calculated in the (LiFePO4) cathode from AC impedance data, which was measured for the A123 18650 LiFePO4 cells during cycling (FIG. 11). Based on Fick's Law and the Butler-Volmer Equation, the diffusion coefficient, D, can be calculated using $$\sigma = \frac{V_m \frac{dE}{dn}}{\sqrt{2}\ ZFS\sqrt{D}} \quad (5)$$

where $\sigma$ is the Warburg coefficient, $V_m$ the molecular volume, E the open circuit voltage, Z the charge number. F the Faraday Constant, and S the surface area of electrode material. The calculated $Li^+$ ion diffusion coefficient ($D_{Li+,\ LiFePO4}$) in the LiFePO4 cathode from AC impedance data is shown in FIG. 10. Clearly, the diffusion coefficients calculated from HESXRD data and from AC impedance data, respectively, has the same trend, decreasing with the cycle number, suggesting that AC impedance is a valid detection method confirmed by in situ HSEXRD measurement. Although there is one order of magnitude difference, it is still in a workable range ($1.8 \times 10^{-14}$ cm$^2$/s). It also demonstrates that long-term cycling caused deterioration of the lattice structure of the electrode and, consequently, the evolvement of the internal cell fault. Under one embodiment, a combined approach of AC impedance and HESXRD in long-term cycling may be utilized to determine LIB cell behavior and failure signatures.

From AC impedance measurement, it can be seen that several parameters are usable as potential signatures for incoming failure (internal cell fault) such as cell temperature ($T_{cell}$), cell voltage ($V_{cell}$) and contact resistance ($R_0$), and resistance of the solid electrolyte ($R_{SEI}$). Validation is preferably performed to determine whether these parameters are actual signatures rather than artificial signals and whether these signatures are directly associated with the failures. In certain embodiments, the failure mechanism of LIB cells may be analyzed under different operating profiles using scanning electron microscopy (SEM), cyclic voltammetry (CV), and High Energy Synchrotron X-ray Diffraction (HESXRD) techniques.

In one embodiment the failure mechanism for cells (e.g., A123 18650 LiFePO4) under overcharge and over-discharge conditions are determined. It has been found that, after failure, burn spots appear on the anode surface and the cathode surface containing burned graphite flakes, as a result of micro-shorting. Clearly, the micro-shorting between the anode and cathode was being developed during the overcharge and normal discharge cycles. It can be seen from FIGS. 12A (normal cycle) and 12B (overcharge cycle) that the potential of the anode started to decrease from 0.10 V at the beginning of the charge and reached −0.05 V at the end of the charge, corresponding to the intercalation of the Li ions into graphite. Meanwhile, the potential of the cathode started to increase from 2.57 V (at the beginning of the charge) to 3.90 V (at the end of the charge) corresponding to the de-intercalation of the Li ions from the LiFePO4 cathode. For the overcharge cycle (FIG. 12B), the potentials of the anode and cathode, as well as the cell voltage, changed in the same pattern as under a normal cycle. However, by the end of the overcharge process, the anode potential shifted more negatively, to −0.32 V, while the cathode potential shifted more positively, to 4.93 V. At the end of the overcharge process, the negative shift of the anode potential from −0.05 V (normal charge) to −0.32 V (10% overcharge) suggests that some reduction reactions may take place on the anode, while the positive shift of the cathode potential from 3.90 V (normal charge) to 4.93 V indicates that some oxidation reactions may occur at the cathode. Exemplary potentials for Fe redox reactions in the battery electrolyte (1.2 M of LiPF6 in EC-EMC (3:7)) using cyclic voltammetry (CV) is listed below:

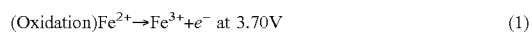
(Oxidation)Fe$^{2+}$→Fe$^{3+}$+e$^-$ at 3.70V    (1)

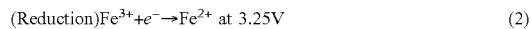
(Reduction)Fe$^{3+}$+e$^-$→Fe$^{2+}$ at 3.25V    (2)

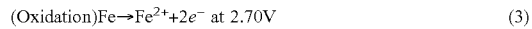
(Oxidation)Fe→Fe$^{2+}$+2e$^-$ at 2.70V    (3)

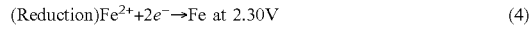
(Reduction)Fe$^{2+}$+2e$^-$→Fe at 2.30V    (4)

Figures 12A, 12B:
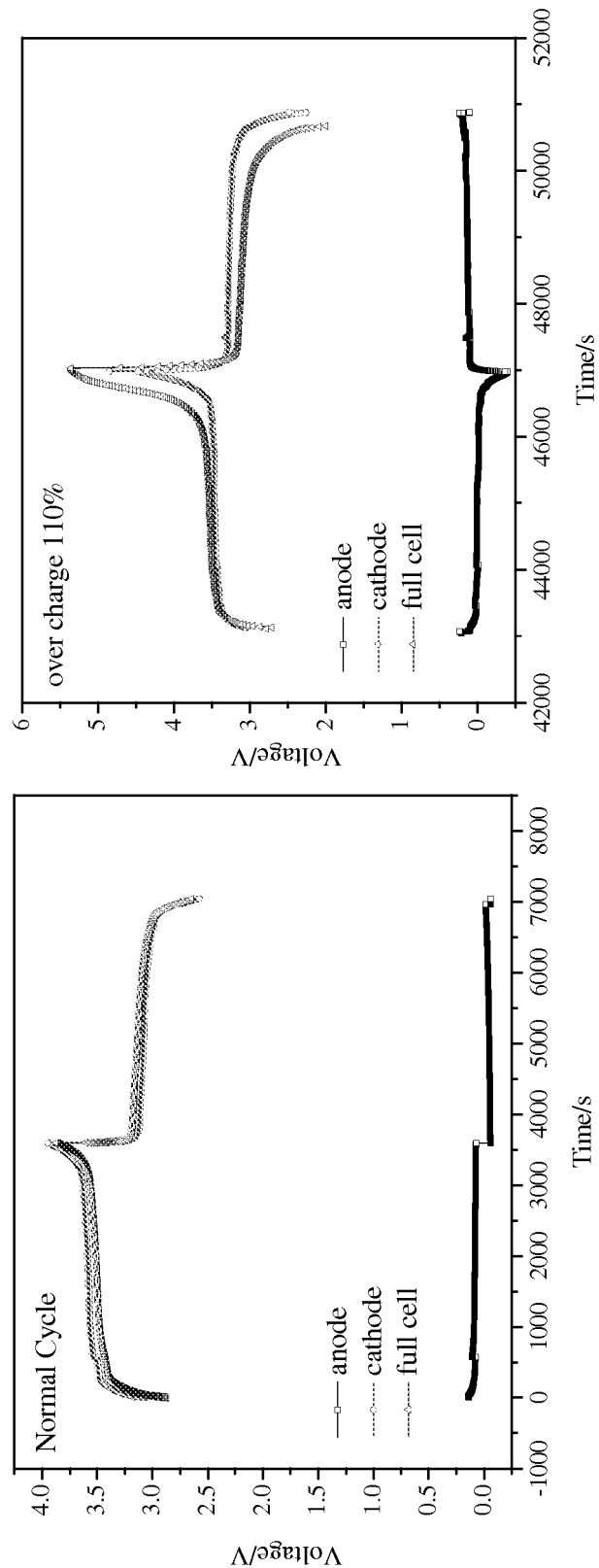
FIGS. 12A-B illustrate variations of anode and cell voltages vs. time during a normal cycle and a overcharge-normal discharge cycle.
Figure 13:
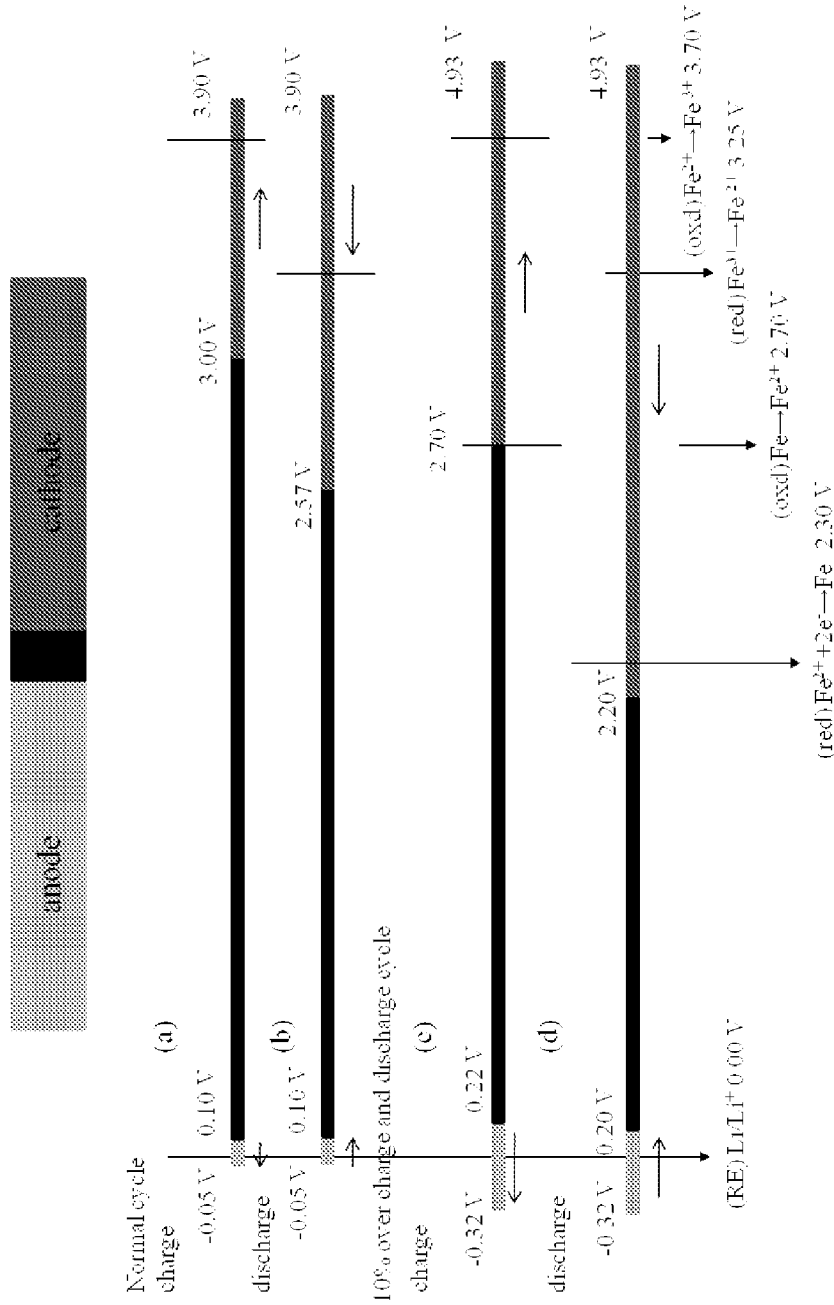
FIG. 13 is a schematic representation of electrode potential of anode and cathode during a multitude of process changes.

Combining the measured potentials and the data in FIGS. 12A-B, a schematic of potential changes and corresponding reactions in a cell (18650 LiFePO$_4$) may be determined as shown in FIG. 13. The figure illustrates anode and cathode potential changes (a) during a charging process and (b) during a discharge process of a normal charge/discharge cycle. Anode and cathode potential change (c) during an oversharging process and (d) during normal discharge process of a cycle of a 10% overcharge and normal discharging cycle, with a reduction potential and redox scale for Fe/Fe$^{2+}$/Fe$^{3+}$ compared to pure Li metal in a LiPF$_6$/EC/EMC electrolyte.

In the charging process of a normal charge/discharge cycle, as seen in FIG. 13(a), the cathode potential increased from 3.00V to 3.90V (also seen in FIG. 12A). In this process, for iron, the only reaction possibly occurring on the cathode is the oxidation reaction (1) of Fe$^{2+}$ to Fe$^{3+}$. In the next discharge process (FIG. 13(b)), the cathode potential decreased from 3.90V to 2.57V (also seen in FIG. 12A). Only in reaction (2) did the reduction of Fe$^{3+}$ to Fe$^{2+}$ occur at the cathode, suggesting that the reduction of Fe$^{2+}$ ions into Fe metal cannot occur at the cathode in the normal charge/discharge cycle because the formation of Fe metal from Fe$^{2+}$ ion reduction requires the cathode potential to be at least equal to or less than 2.30V. In the charge process of the 10% overcharge-discharge cycle, shown in FIG. 13(c), the cathode potential increased from 2.70V to 4.93V (also seen in FIG. 12B), and reactions (1) and (3) occurred, namely, metallic Fe was oxidized to Fe$^{2+}$ at 2.70V, then Fe$^{2+}$ was further oxidized into Fe$^{3+}$ at 3.70V at the cathode. In the next discharge process, the cathode potential decreased from 4.93V to 2.20V, while reduction reactions (2) and (4) sequentially proceeded, suggesting that Fe$^{3+}$ was reduced to Fe$^{2+}$ at 3.25 V and Fe$^{2+}$ was further reduced to Fe metal at 2.30V. Compared with the discharge processes in normal cycles, reaction (4) could not take place at the cathode because the cathode potential reached only 2.57V (FIG. 13(b)) and never reached 2.20V (FIG. 13(d) and FIG. 12B). This demonstrates that under normal cycling conditions, no Fe dendrites should form at the cathode. Hence, Fe dendrites should not be the root cause of the failure for LiFePO$_4$ cells under normal cycling conditions, which explains why these LiFePO$_4$ cells have an excellent cycle life, more than 1950 cycles with an 80% initial capacity (FIG. 1). Thus, with overcharge cycling, the Fe dendrite will grow from both the anode side and the cathode side. Eventually, these dendrites will penetrate through the separator, causing an internal short. Since the amount of metallic Fe is very small, these shorts should be micro-shorts, causing heat generation and, consequently, an increase of cell temperature ($T_{cell}$). The increased temperature may deteriorate the solid electrolyte interface (SEI), increasing the diffusion barrier for Li$^+$ ions through SEI layer, causing the R$_0$ and R$_{SEI}$ increase. Hence, $T_{cell}$, R$_0$ and R$_{SEI}$ are preferably the signatures associated with failure. For failure mechanisms for over-discharge, the Cu bridge from the dissolution of the Cu current collector under over-discharge causes micro-shorting.

Cell voltage (V$_{cell}$) is preferably measured from the cell terminals for each cell. Cell temperature (T$_{cell}$) may be measured from either the cell terminal tab (which is close to the cell's inside temperature) or from the skin of the cell. The temperature measurement may comprise a micro-thermal couple or a wireless passive RFID temperature sensor (if wiring is a concern). The V$_{cell}$ and T$_{cell}$ can also be obtained from the battery management system (BMS) or battery pack management system (BPMS). Under one embodiment, AC impedance measurement may be done using a National Instruments 16E card by sending AC sine waves with different frequencies to cell terminals to measure the cell impedance, Z. The measured $V_{cell}$, $T_{cell}$, and Z may be processed using an algorithm developed for failure detection.

Failure signals/signatures (e.g., sharp increase of cell temperature, sudden drop of cell voltage, etc.) may be identified for different failure modes that are associated with parameters that can be measured in real time or near real time including cell temperature ($T_{cell}$), cell voltage ($V_{cell}$), operating current ($I_{op}$), contact resistance ($R_0$), and resistance of the solid electrolyte ($R_{SEI}$) from the AC impedance measurement. After the failure signatures are identified, they may be stored and used for subsequent online monitoring of the battery system because all failure signatures are associated with parameters that can be measured in real time.

Figure 14A:
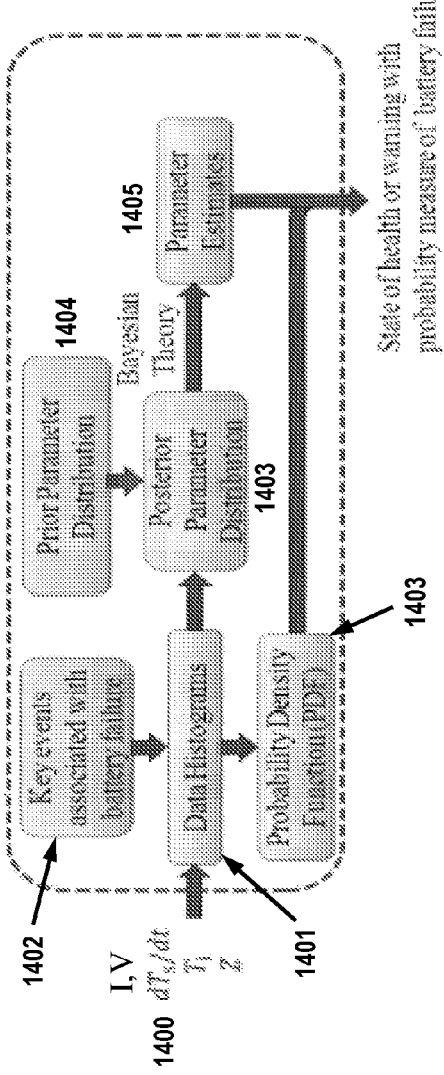
FIG. 14A-B illustrate embodiments utilizing predictive battery failure techniques based on probabilistic and fuzzy system arrangements.
Figure 14B:
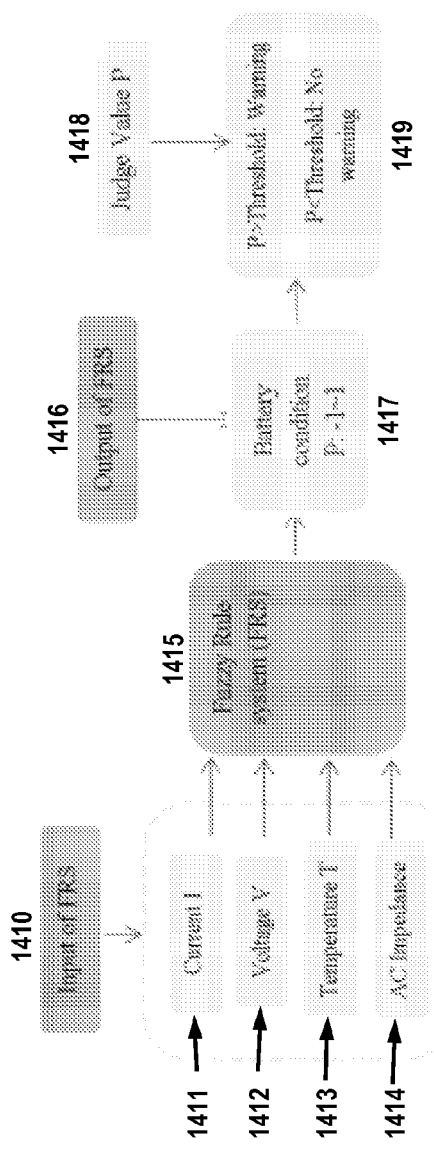

To issue accurate and reliable warning signals based on the failure signatures, advanced algorithms may be used comprising probabilistic methods and Fuzzy system methods. The algorithm block diagrams for both methods are shown in FIGS. 14A-B. Both methods should be able to take real time measurements of cell temperature ($T_{cell}$), cell voltage ($V_{cell}$), operating current ($I_{op}$), contact resistance ($R_0$), and resistance of the solid electrolyte ($R_{SEI}$) as inputs and issue warning signals before potential battery failure. It should be noted that AC impedance measurements may also be used under the present disclosure because they have very important features for failure detection, especially for long-term cycle test monitoring.

An exemplary probabilistic warning system is shown in FIG. 14A. Initially, training data is used to build data histograms. For each testing condition, multiple iterations for inputs 1400 are carried out to generate sufficient data sets for subsequent analysis. Inputs 1400 are processed according to key events associated with battery failure 1402 in order to form data histograms 1401, where probability density function (PDF) 1403 will be obtained from the processing of the data histograms with unknown parameters. To get more accurate results, Bayesian methods are potentially employed. Assuming prior parameter distribution (e.g., normal distribution) 1404 based on empirical data and data processing, posterior parameter distribution 1403 will be updated using newly obtained data. The probability of battery failure can be calculated through the PDF with estimated parameters from 1405. Depending on the threshold of issuing warning signals for battery failure, tradeoffs may be made between warning signal issuing time (e.g., how much time left to battery failure) and the probability of battery failure.

An exemplary warning system based on fuzzy logic is illustrated in FIG. 14B. Here, the basic elements of the fuzzy system include fuzzy membership function and fuzzy rule sets. The fuzzy system assigns degrees of set membership to every input signal 1410, which comprises current 1411, voltage 1412, temperature 1413, and AC impedance 1414 signals that are collected and fed into a Simulink model as four inputs. The output 1416 of the fuzzy system would indicate the battery condition, where it is illustrated in FIG. 14B as the parameter P between −1 and 1. Under normal operating conditions, the value of P should be between −1 and 0. When potential battery failure is going to occur, the value of P should be between 0 and 1. The actual threshold used for the battery failure may vary, and may rely on the battery type, conditions, etc. and training data collected beforehand. As parameter P is processed in 1418, a warning signal will be issued before the parameter P reaches the threshold in 1419.

Under a preferred embodiment, the developed techniques are implemented on a hardware system, which is able to operate in real time for failure detection and warning. This system will be designed to obtain parameters of battery operation and to execute the algorithms in real time. According to requirements, a variety of systems are feasible, including a control and monitoring system such as a CompactRio data acquisition system from National Instrumentation. Preferably, the hardware should be configured perform multiple functions, such as real-time implementation and data acquisition in the same unit, and be extended with more input and output channels. Exemplary modules configured for use in a system, such as the CompactRio system includes a thermocouple (NI 9213) having multiple (e.g., 16) channels for temperature measurements, a data acquisition card (NI 16E), capable of measuring AC impedance parameters, a cell input card (NI9206), which can measure voltage (e.g., +/−10V on 16 channels), and a current input card (NI 9227), for measuring current (e.g., up to 5 Amps of input current in 4 current channels). Additionally, a real time processor controller (e.g., PowerPC controller), a main processor, storage (e.g., 4 GB), and other memory (e.g., DRAM) should be used. Additionally, a battery tester (e.g., Arbin Instruments Battery tester model no. BT-G-25) having multiple (e.g., 32) voltage- and current-controlled channels would be advantageous.

Under one embodiment, the control and monitoring system communicates to a host computer via Ethernet, and/or can be placed anywhere in a network and controlled via a remote computer. The thermocouple should be configured to acquire the skin temperature of cell, while the data acquisition card measures impedance parameters. The cell input card is used to measure the differential voltage across the cell, and current input card is used to measure the current passing through the cell. The same computer or a different computer is used to send control commands to the battery tester. The host computer may be configured with testing software (e.g., NI Veristand 2010) to communicate with the control and monitoring system, whereas the host computer uses battery testing software (e.g., Arbin MITS Pro) to communicate with the battery tester. The failure detection algorithms may be built in Matlab\Simulink and then compiled using the NI Veristand .dll file. In NI Veristand, a user interface is designed to check the experiment results in real-time and the data is logged in .tdms files which are converted to Matlab and analyzed.

Similar setups may be used for module and pack level testing of LIB. Here, the cell may be replaced by either a module with a string of multiple (e.g., 8) cells in parallel or a pack with multiple (e.g., 2) modules connected in series. The sensors in each cell will provide the necessary data for the module and the pack. Indexing of the sensor data for each cell will ensure proper identification of the failure linking to a particular cell or module.

Figure 15A:
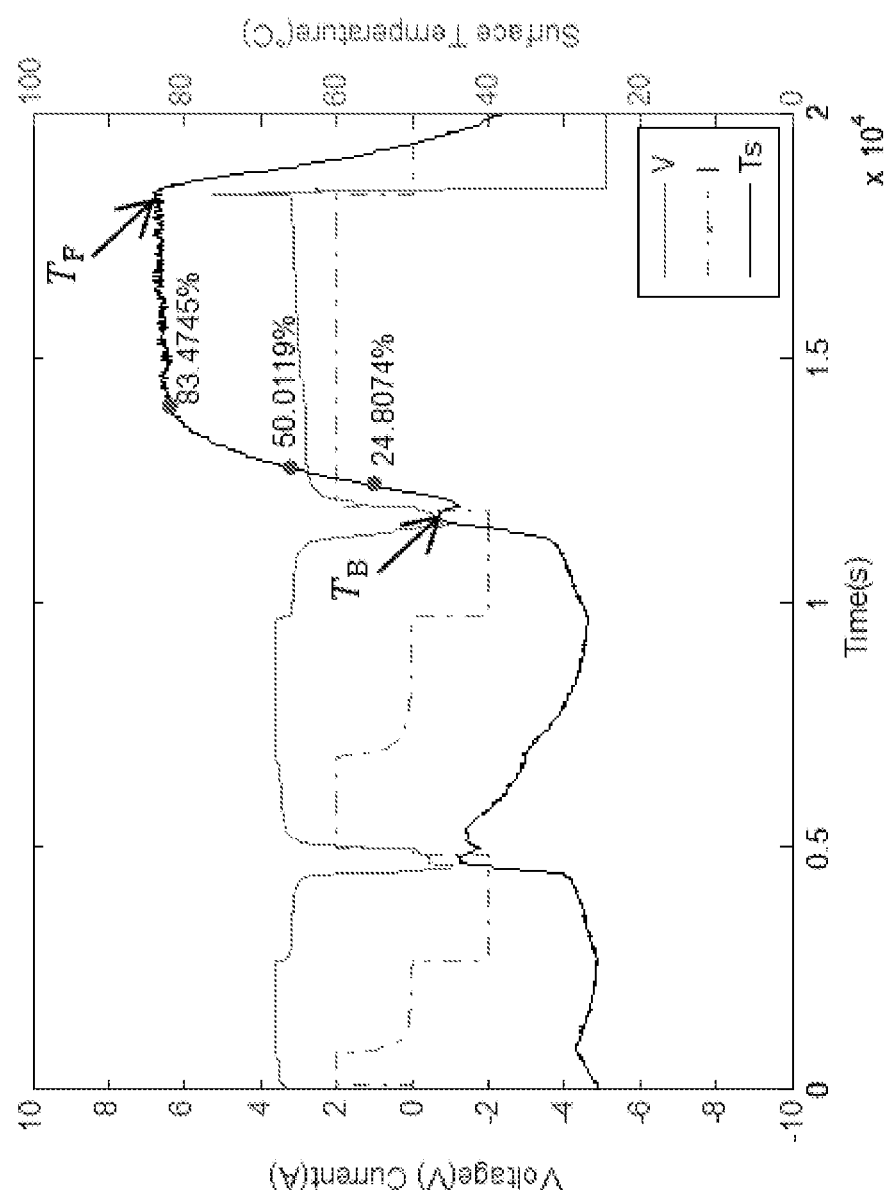
FIGS. 15A-B illustrate exemplary probabilities of battery failure based on over-discharge condition under normal and high temperatures.
Figure 15B:
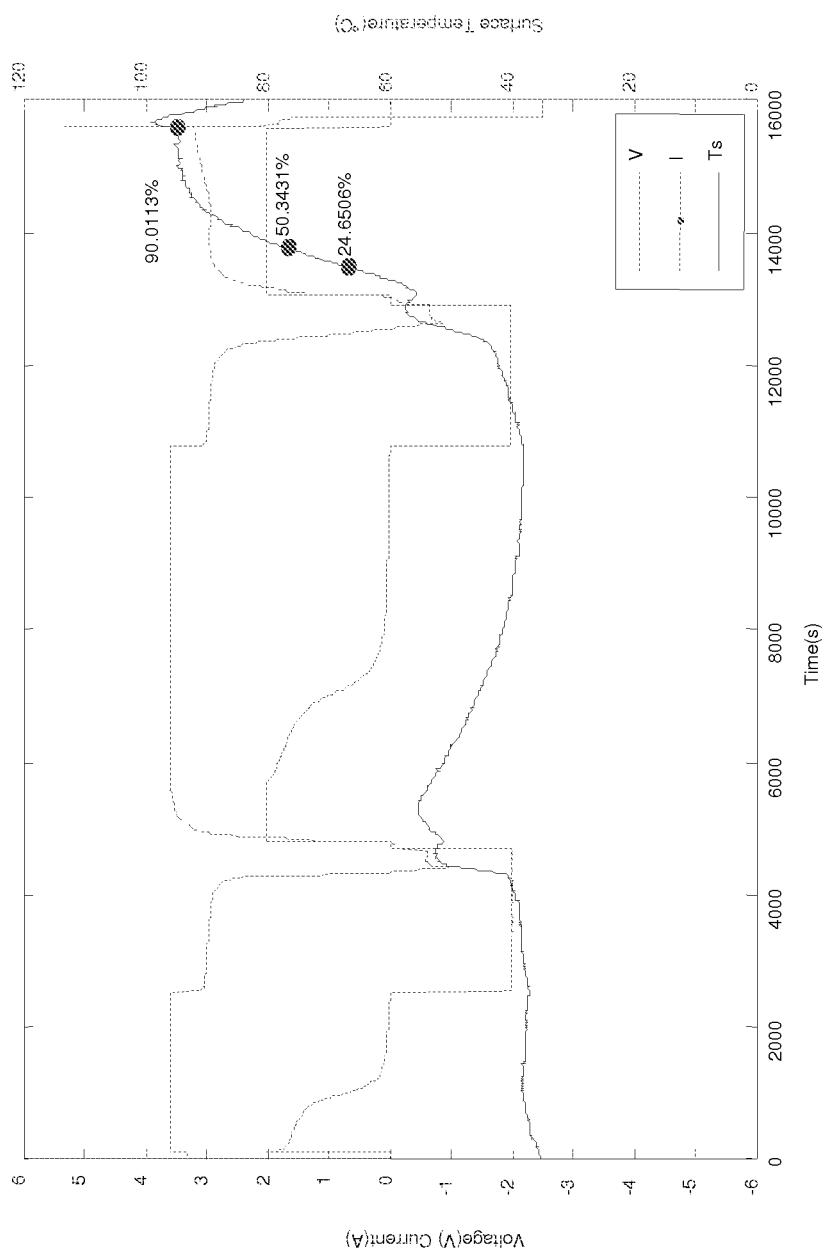

Exemplary results utilizing a probabilistic technique are illustrated in FIG. 15A, which demonstrates the probability of failure for a 2 C over-discharge condition at room temperature (20° C.), and FIG. 15B illustrates the probability of failure for a 1 C over-discharge condition at a high temperature (35° C.). For overcharge conditions, FIG. 16A illustrates the data on the probability of failure for a 1 C overcharge condition at room temperature (20° C.), and FIG. 16B shows the probability of failure for a 2 C overcharge condition at room temperature (20° C.).

Figure 16A:
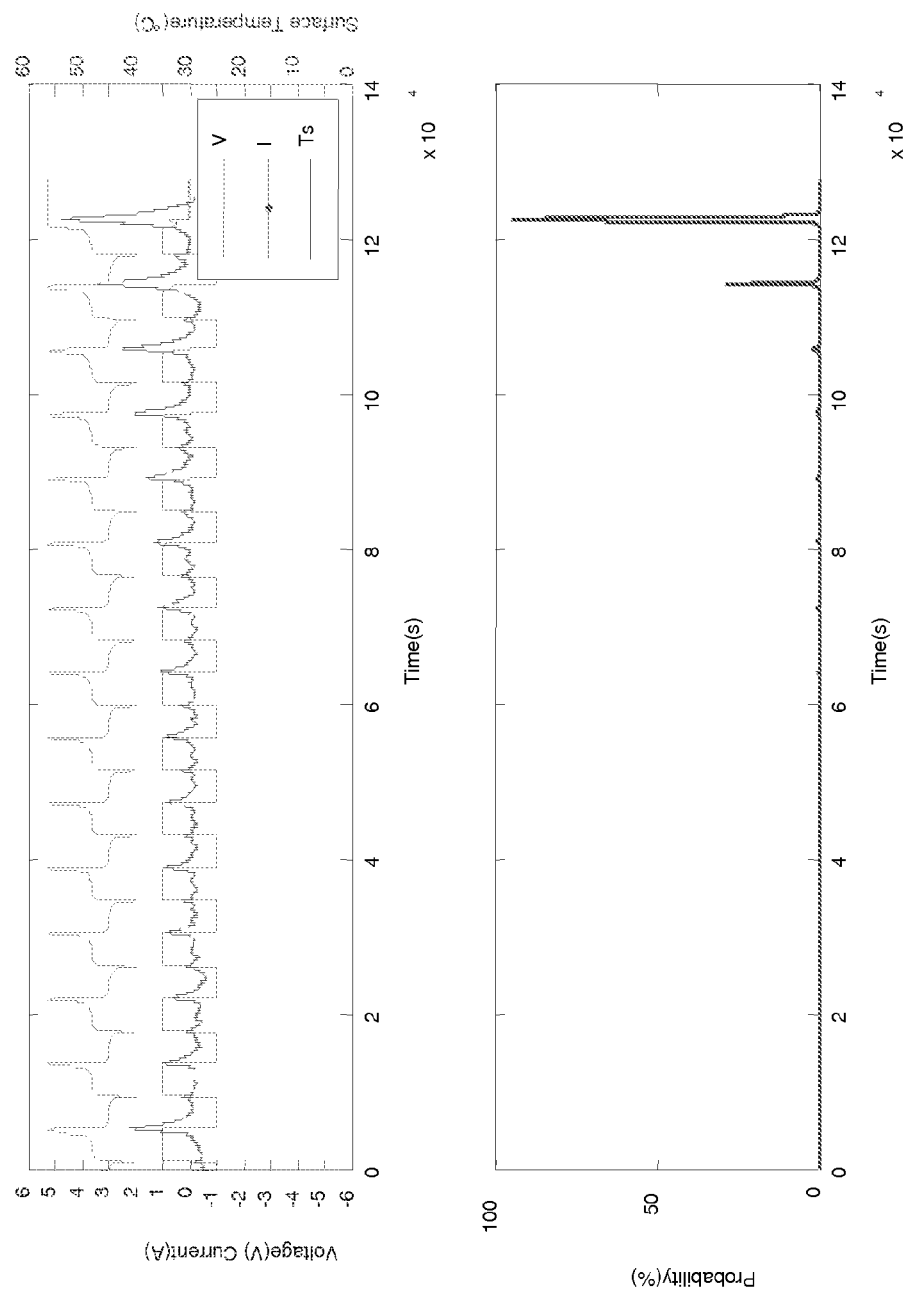
FIGS. 16A-B illustrate exemplary probabilities of battery failure based on overcharge conditions.
Figure 16B:
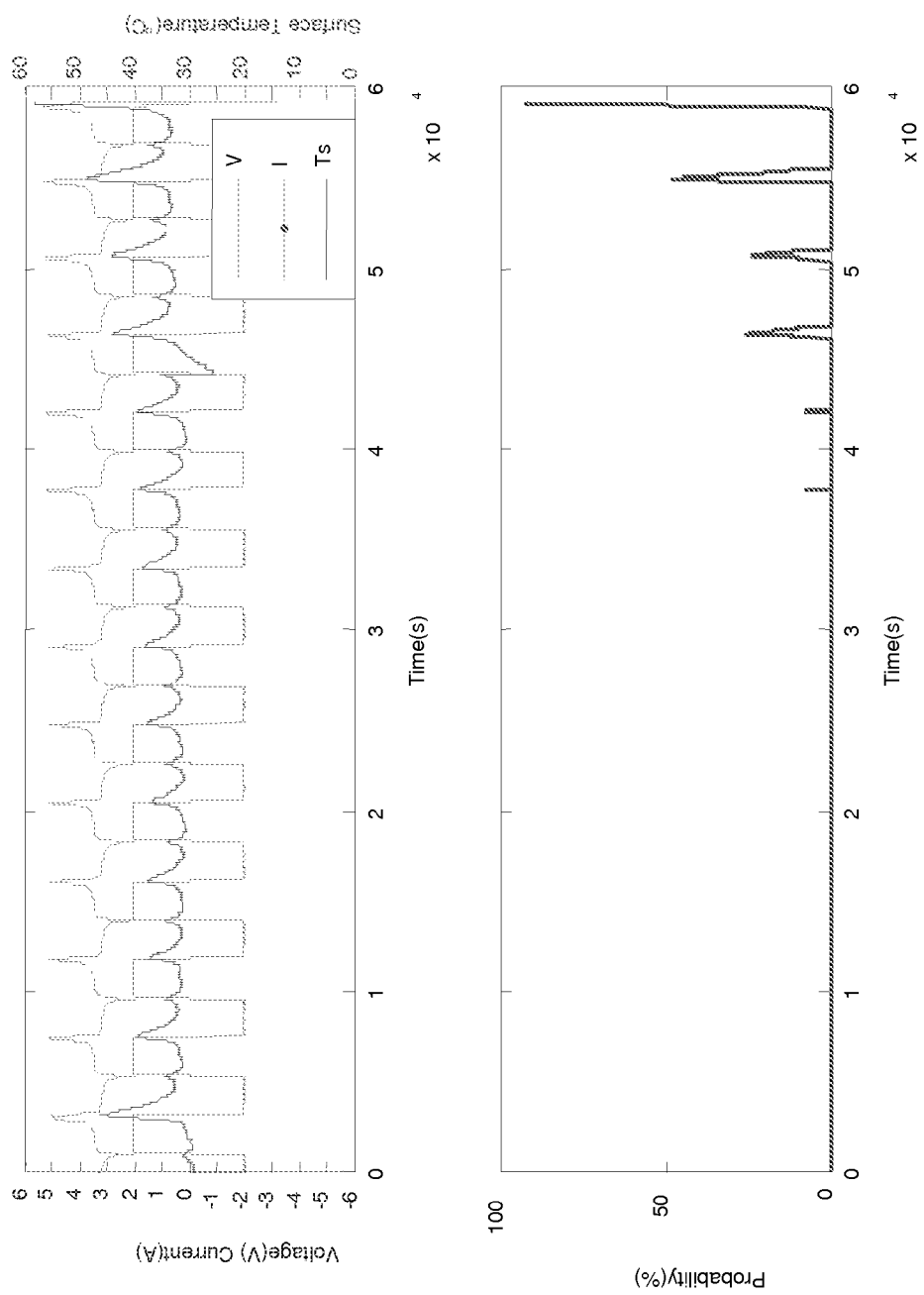
Figure 17A:
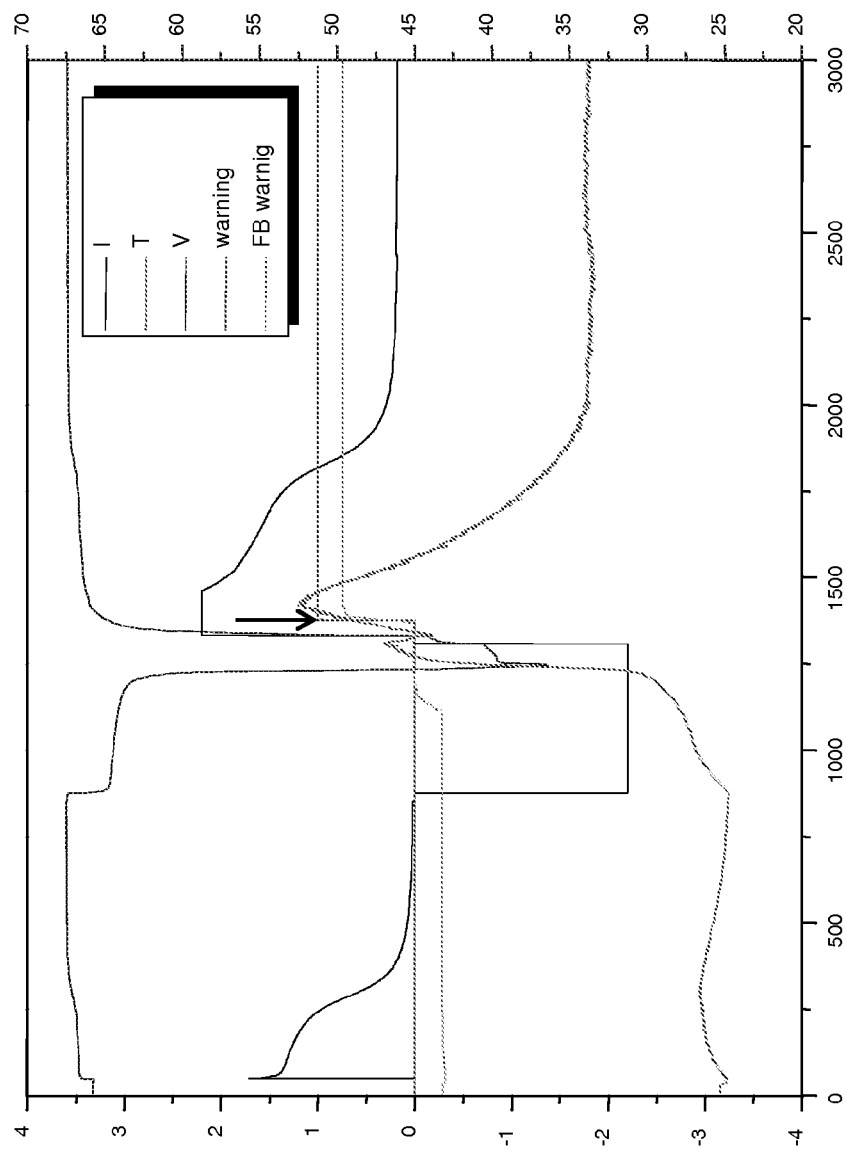
FIGS. 17A-B illustrate fuzzy system-based warning for over-discharge condition at room temperature and high temperature.
Figure 17B:
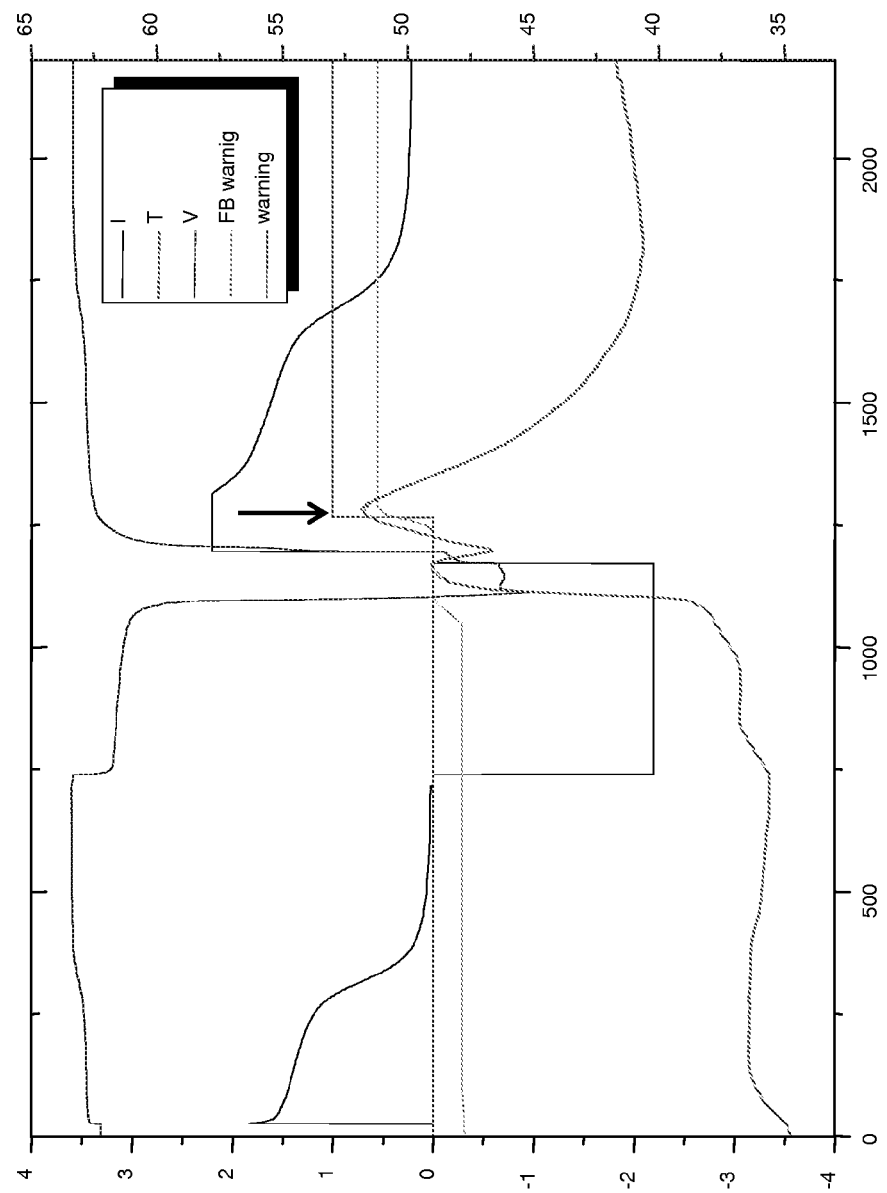
Figure 18A:
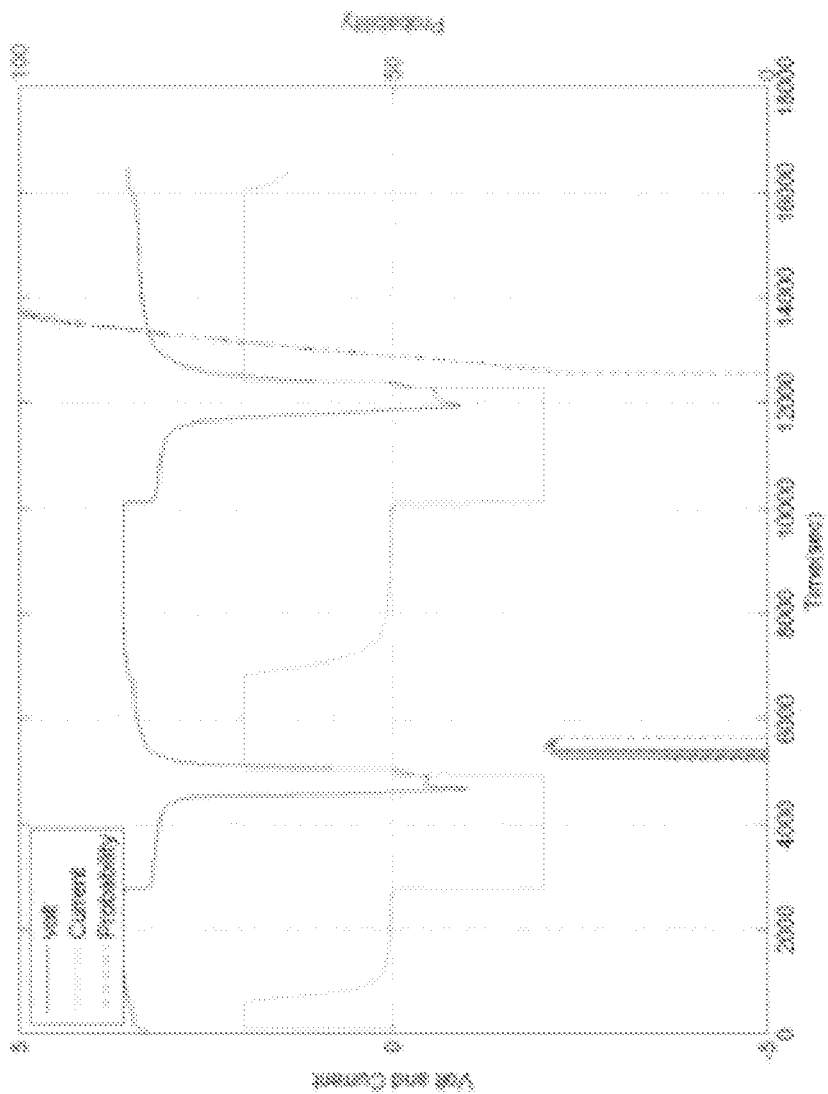
FIG. 18A-B illustrates failure warning for a 2 C over-discharge condition at room temperature high temperature.
Figure 18B:
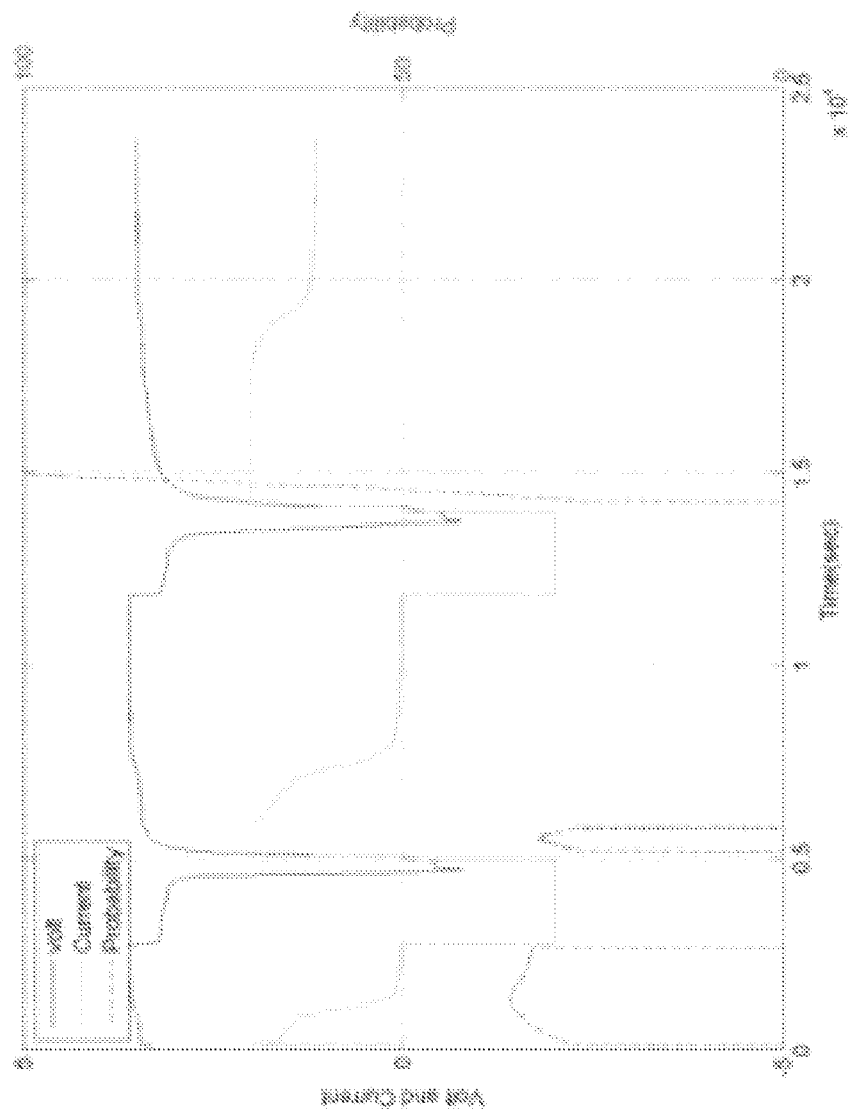

A fuzzy system methods for over-discharge conditions is illustrated in FIG. 16A, where the figure shows the data on the fuzzy system-based warning for a 2 C over-discharge condition at room temperature (20° C.), and FIG. 16B shows the data on the fuzzy system-based warning for a 2 C over-discharge condition at a high temperature (35° C.). Regarding hardware system performance for over-discharge conditions, FIG. 17A shows the failure warning of the hardware system for a 2 C over-discharge condition at room temperature (20° C.), and FIG. 17B shows the failure warning of the hardware system for a 2 C over-discharge condition at high temperature (35° C.). It can be seen that the probabilistic methods, the fuzzy system methods, and the hardware system are able to detect the failure and issue the warning signal in real time before potential failure occurs.

It can be seen from the present disclosure that the techniques described herein provides an advance in battery warning systems by taking into account changes of the physical structure and chemical composition of LIB cell components using SEM, TEM, CV, AC impedance, and high-energy synchrotron X-ray diffraction (HESXRD). Consequently, the identified signatures (from the root cause study and failure behavior) are directly associated with failure causes. Such a signature will lead to accurate and reliable detection of the internal cell fault with high sensitivity and high specificity. The disclosed online monitoring system is not only capable of detecting the internal cell faults/failure; it is also capable of issuing an accurate and reliable warning for incoming failure with great robustness. In addition to using cell voltage ($V_{cell}$) and cell temperature ($T_{cell}$) as the signatures, AC impedance ($Z_{cell}$) may be used to detect and monitor the internal cell fault and the state of health of the LIB cells during long-term cycling. Since the detection system disclosed herein is based on fundamental faults/failures irrespective of cell chemistry, the configurations disclosed herein can be easily adjusted for different/new cell chemistries. As different/new values are generated for the signatures, implementation of these signatures (modified values) may be readily employed into a detection system. This would directly result in a more robust and adaptive detection system.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient and edifying road map for implementing the described embodiment or embodiments. It should be understood that various changes can be made in the function and arrangement of elements without departing from the scope of the invention and the legal equivalents thereof.

What is claimed is:

1. A system for monitoring and predicting battery faults, comprising: at least one of a plurality of relays that is used to control the input of voltage to a plurality of battery modules, at least one of a plurality of sensors that is used to detect incoming current or voltage difference, at least one of the plurality of battery modules that is operatively coupled with a set of equalization current lines and a set of voltage sense lines to a pack management system, wherein the at least one of the plurality of battery modules is indexed to provide individual measurements that are forwarded individually to a monitor system, which processes these measurements and provides an output that is utilized to determine a state of-health or a warning of a failure condition.

2. The system of claim 1, wherein the measurements comprise an internal battery temperature, a battery voltage, an impedance, and a current.

* * * * *